(12) United States Patent
Souk et al.

(10) Patent No.: US 7,403,240 B2
(45) Date of Patent: Jul. 22, 2008

(54) THIN FILM TRANSISTOR ARRAY PANEL AND MANUFACTURING METHOD THEREOF

(75) Inventors: Jun-Hyung Souk, Yongin (KR); Jeong-Young Lee, Yongin (KR); Jong-Soo Yoon, Cheonan (KR); Kwon-Young Choi, Seoul (KR); Bum-Ki Baek, Suwon (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/741,470

(22) Filed: Apr. 27, 2007

(65) Prior Publication Data
US 2007/0200981 A1    Aug. 30, 2007

Related U.S. Application Data

(63) Continuation of application No. 10/759,389, filed on Jan. 16, 2004, now Pat. No. 7,265,799.

(30) Foreign Application Priority Data

Jan. 17, 2003   (KR) .............................. 2003-003299

(51) Int. Cl.
*G02F 1/136* (2006.01)
*G02F 1/1335* (2006.01)
(52) U.S. Cl. ........................................ 349/43; 349/106
(58) Field of Classification Search .................. 349/43, 349/106; 257/59, 72
See application file for complete search history.

(56) References Cited

U.S. PATENT DOCUMENTS 5,977,562 A    11/1999   Hirakata et al.

6,414,730 B1    7/2002   Akamatsu et al.

(Continued)

FOREIGN PATENT DOCUMENTS

CN    1384394    12/2002

(Continued)

OTHER PUBLICATIONS

English Language Abstract, CN Patent First Publication No. 1384394, Dec. 11, 2002, 1 page.

(Continued)

*Primary Examiner*—James A Dudek
(74) *Attorney, Agent, or Firm*—MacPherson Kwok Chen & Heid LLP

(57) ABSTRACT

A method of manufacturing a thin film transistor array panel is provided, the method includes: forming a gate line on an insulating substrate; forming a gate insulating layer; forming a semiconductor layer; forming a data conductive layer including a data line and a drain electrode; depositing a passivation layer; forming a photoresist including a first portion located on an end portion of the gate line, a second portion thicker than the first portion and located on the drain electrode, and a third portion thicker than the second portion; exposing a portion of the passivation layer under the second portion of the photoresist and a portion of the gate insulating layer under the first portion of the photoresist by etching using the photoresist as an etch mask; forming first and second contact holes exposing the drain electrode and the end portions of the gate line, respectively; and forming a pixel electrode connected to the drain electrode through the first contact hole.

5 Claims, 41 Drawing Sheets

U.S. PATENT DOCUMENTS

| | | |
|---|---|---|
| 7,095,459 B2 | 8/2006 | Yoo et al. |
| 7,259,806 B1 * | 8/2007 | Lee et al. ................. 349/43 |
| 2002/0074549 A1 | 6/2002 | Park et al. |
| 2002/0140876 A1 | 10/2002 | Yoo et al. |
| 2003/0076452 A1 | 4/2003 | Kim et al. |
| 2004/0046905 A1 | 3/2004 | Hong et al. |
| 2005/0030443 A1 | 2/2005 | Lee et al. |
| 2005/0078233 A1 | 4/2005 | Lim et al. |

OTHER PUBLICATIONS

English version of Chinese Office Action corresponding to Chinese Patent Application No. 2004100000993.9, 7 pages.

* cited by examiner

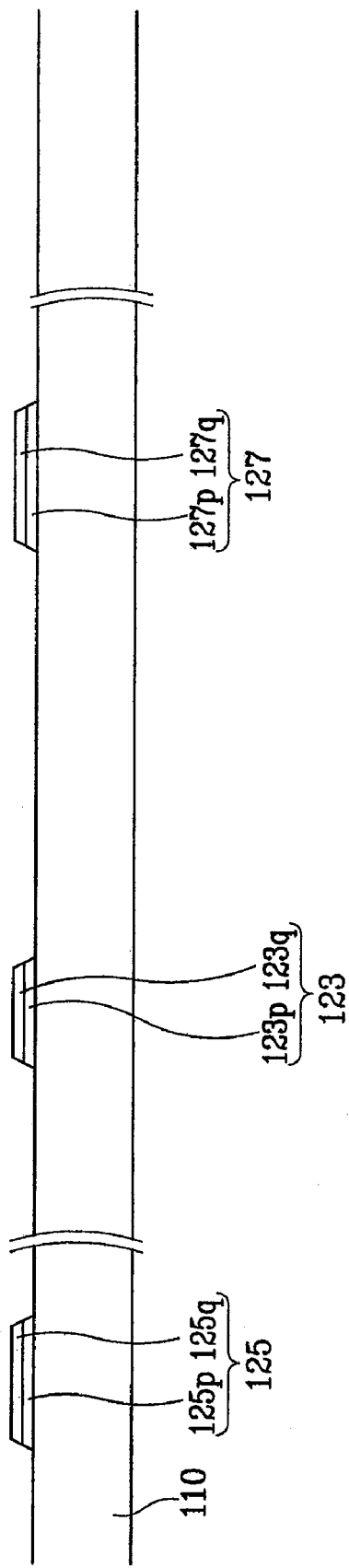

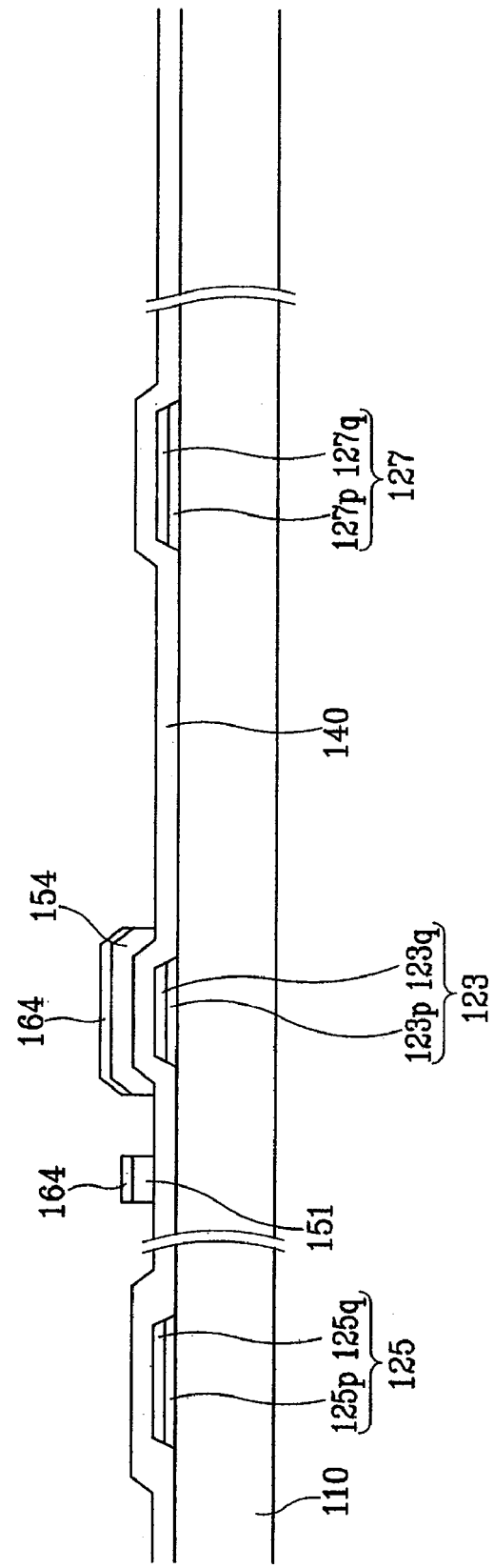

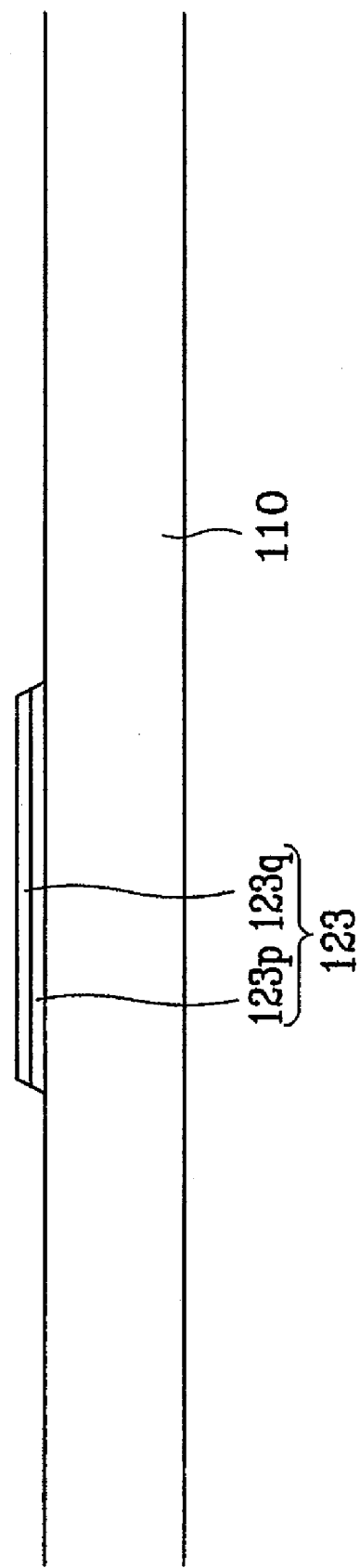

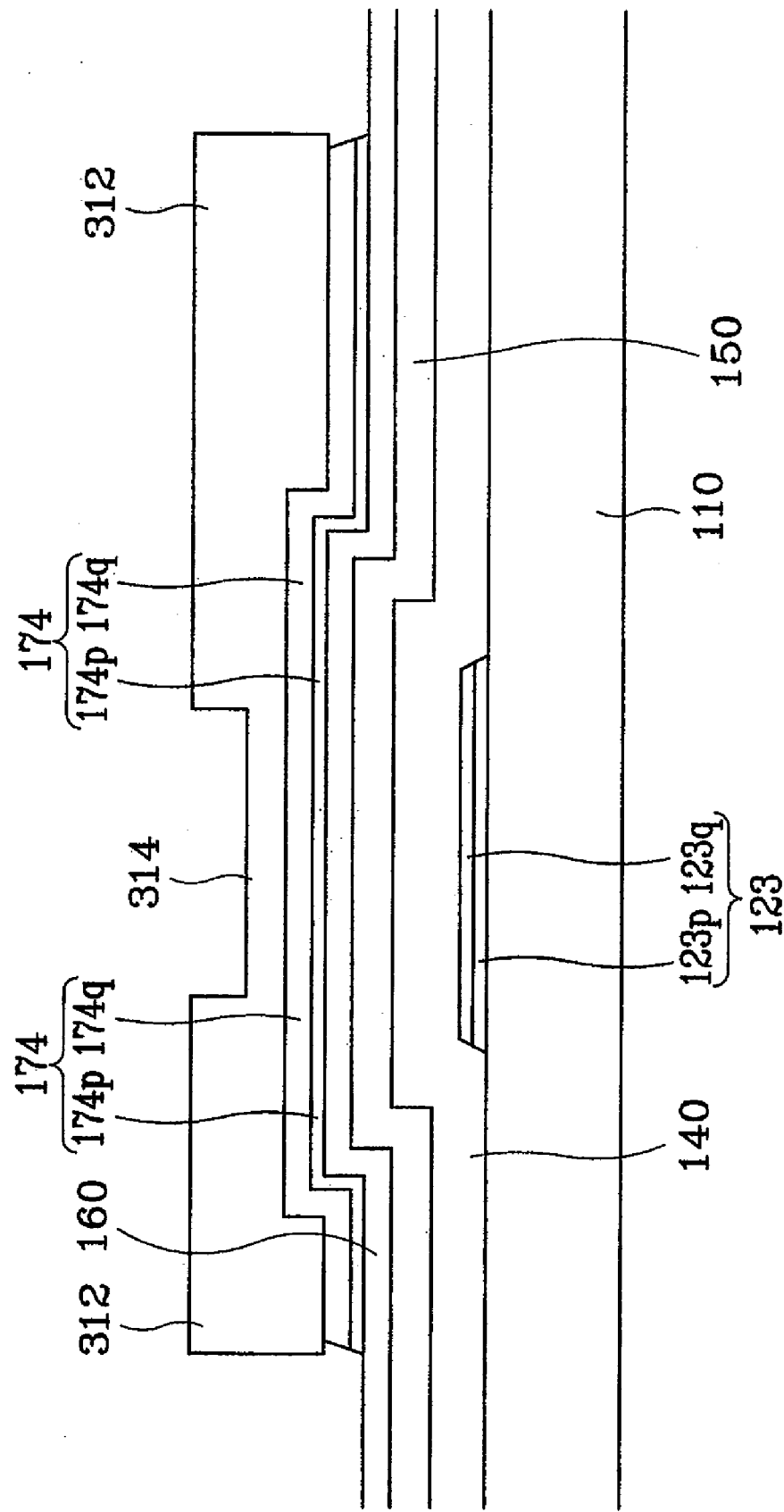

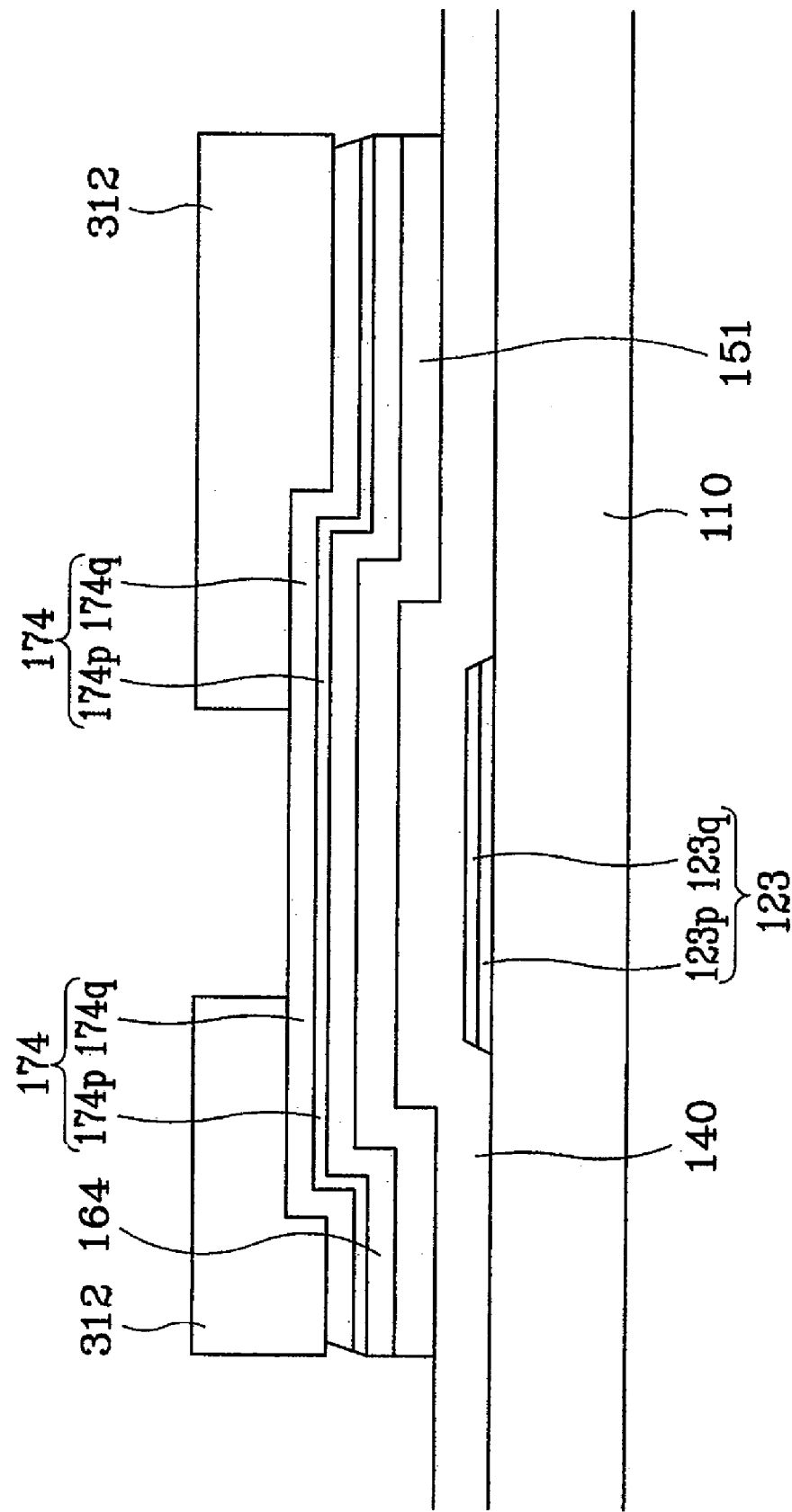

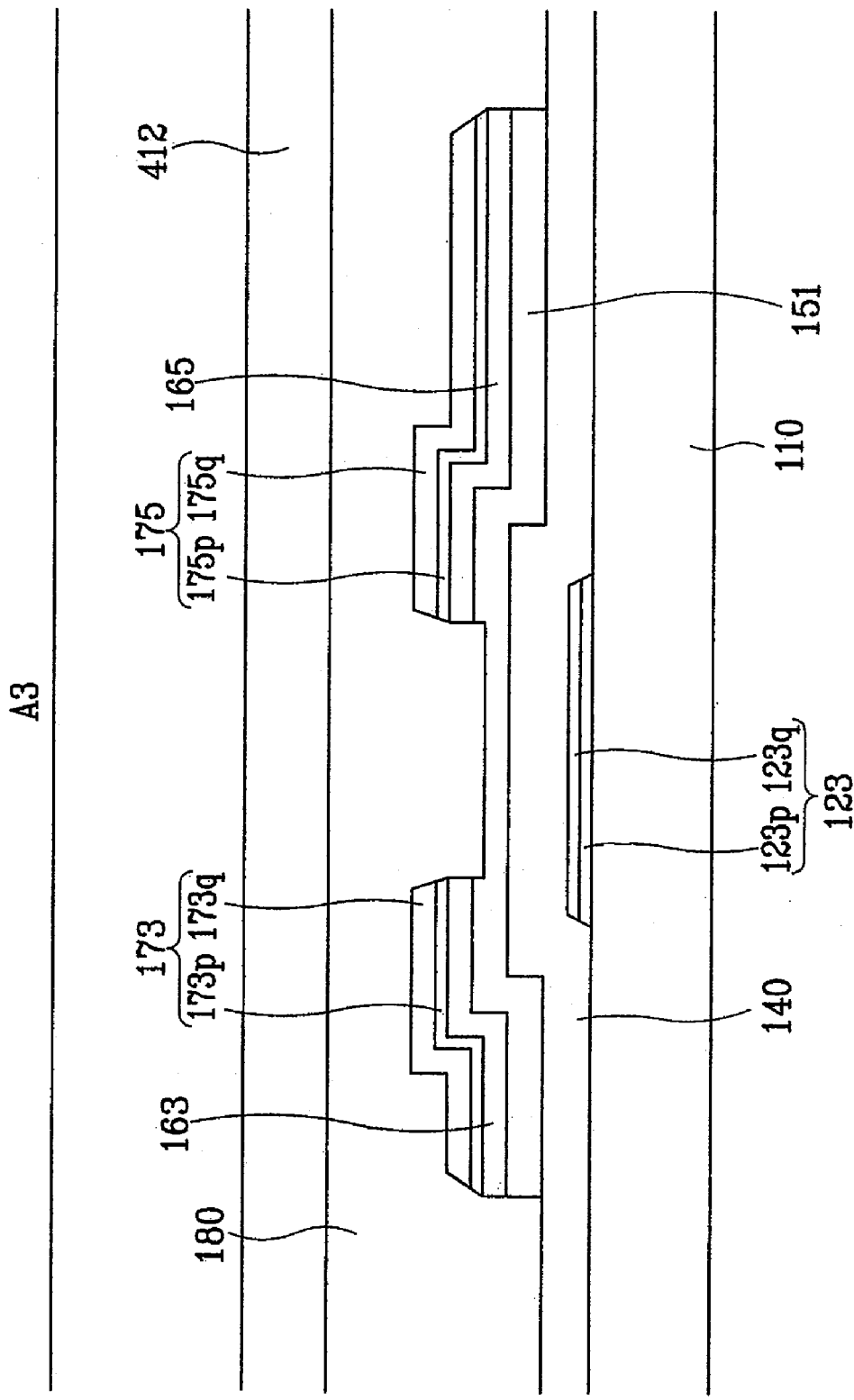

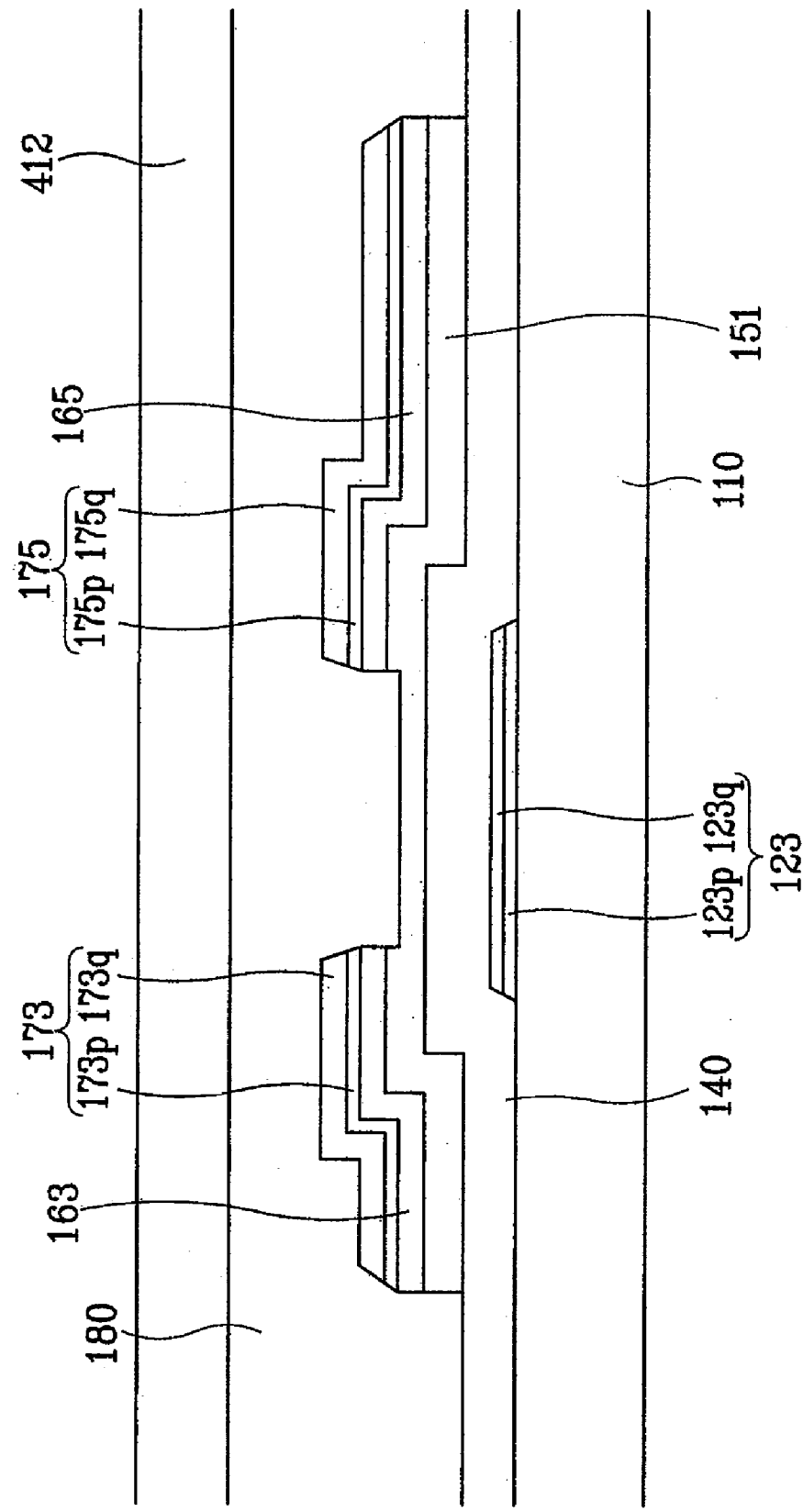

THIN FILM TRANSISTOR ARRAY PANEL AND MANUFACTURING METHOD THEREOF

CROSS-REFERENCE TO RELATED APPLICATION

This application is a continuation of U.S. patent application Ser. No. 10/759,389 filed Jan. 16, 2004 now U.S. Pat. No. 7,265,799, which application claims priority of Korean Patent Application No. 2003-003299 filed Jan. 17, 2003, incorporated herein by reference in their entireties.

BACKGROUND OF THE INVENTION (a) Field of the Invention

The present invention relates to a thin film transistor array panel and a manufacturing method thereof.

(b) Description of the Related Art

Liquid crystal displays (LCDs) are one of the most widely used flat panel displays. An LCD includes two panels provided with field-generating electrodes and a liquid crystal (LC) layer interposed therebetween. The LCD displays images by applying voltages to the field-generating electrodes to generate an electric field in the LC layer, which determines orientations of LC molecules in the LC layer to adjust polarization of incident light.

Among LCDs including field-generating electrodes on respective panels, a type of LCD provides a plurality of pixel electrodes arranged in a matrix on one panel and a common electrode covering an entire surface of the other panel. The image display of the LCD is accomplished by applying individual voltages to the respective pixel electrodes. For the application of the individual voltages, a plurality of three-terminal thin film transistors (TFTs) are connected to the respective pixel electrodes, and a plurality of gate lines transmitting signals for controlling the TFTs and a plurality of data lines transmitting voltages to be applied to the pixel electrodes are provided on the panel.

The panel for an LCD has a layered structure including several conductive layers and several insulating layers. The gate lines, the data lines, and the pixel electrodes are made from different conductive layers (referred to as "gate conductor," "data conductor," and "pixel conductor" hereinafter) preferably deposited in sequence and separated by insulating layers. A TFT includes three electrodes: a gate electrode made from the gate conductor and source and drain electrodes made from the data conductor. The source electrode and the drain electrode are connected by a semiconductor usually located thereunder, and the drain electrode is connected to the pixel electrode through a hole in an insulating layer.

The gate conductor and the data conductor are preferably made of an Al containing metal such as Al and Al alloy having low resistivity for reducing the signal delay in the gate lines and the data lines. The pixel electrodes are usually made of a transparent conductive material such as indium tin oxide (ITO) and indium zinc oxide (IZO) for both the field generation upon voltage application and the light transmission.

In the meantime, the contact between Al containing metal and ITO or IZO causes several problems such as corrosion of the Al containing metal and large contact resistance.

As described above, a drain electrode and a pixel electrode are connected through a contact hole in an insulator. This connection is obtained by forming the hole in the insulator to expose a portion of an upper Al-containing metal layer of the drain electrode, removing the exposed portions of the upper metal layer by blanket-etching to expose a lower layer having good contact characteristic, and finally, forming the pixel electrode thereon. However, the blanket etch frequently generates undercut formed by over-etching the Al containing metal under a sidewall of the contact hole. The undercut yields disconnection or poor profile of the subsequently-formed pixel electrode near the undercut to increase the contact resistance between the pixel electrode and the drain electrode.

SUMMARY OF THE INVENTION

A thin film transistor array panel is provided, which includes: a gate line formed on an insulating substrate; a gate insulating layer on the gate conductive layer; a semiconductor layer on the gate insulating layer; a data line formed on the gate insulating layer and including a source electrode; a drain electrode formed at least in part on the semiconductor layer; a passivation layer formed on the data line and the drain electrode and having a first contact hole exposing the drain electrode at least in part and a portion of the gate insulating layer; and a pixel electrode formed on the passivation layer and contacting the drain electrode and the exposed portion of the gate insulating layer through the first contact hole.

At least one of the gate line, the data line, and the drain electrode preferably includes a lower film of Cr, Mo or Mo alloy and an upper film of Al or Al alloy.

The passivation layer may include silicon nitride, and the pixel electrode preferably includes IZO.

The passivation layer may have second and third contact holes exposing end portions of the gate line and the data line, and the thin film transistor array panel may further include contact assistants contacting the exposed end portions of the gate line and the data line.

A method of manufacturing a thin film transistor array panel is provided, the method includes: forming a gate line on an insulating substrate; forming a gate insulating layer; forming a semiconductor layer; forming a data conductive layer including a data line and a drain electrode; depositing a passivation layer; forming a photoresist including a first portion located on an end portion of the gate line, a second portion thicker than the first portion and located on the drain electrode, and a third portion thicker than the second portion; exposing a portion of the passivation layer under the second portion of the photoresist and a portion of the gate insulating layer under the first portion of the photoresist by etching using the photoresist as an etch mask; forming first and second contact holes exposing the drain electrode and the end portions of the gate line, respectively; and forming a pixel electrode connected to the drain electrode through the first contact hole.

The photoresist may further include a fourth portion disposed on an end portion of the data line, and the method further comprises forming a third contact hole exposing the end portion of the data line.

The exposure is preferably performed by dry etching under a condition that etching ratios for the photoresist and the passivation layer are substantially the same.

The exposed portion of the gate line is preferably thicker than the exposed portion of the passivation layer.

The formation of the first and second contact holes is preferably performed by dry etching under a condition that etching ratios for the gate insulating layer and the passivation layer are substantially the same.

The gate line or the data line may include a lower film of Cr, Mo or Mo alloy and an upper film of Al or Al alloy.

The method may further include: removing the upper film before forming the pixel electrode.

The pixel electrode may include IZO, and the data line and the semiconductor layer may be formed using a single photoresist film.

BRIEF DESCRIPTION OF THE DRAWINGS

The present invention will become more apparent by describing embodiments thereof in detail with reference to the accompanying drawings in which:

FIGS. 4B, 5B, 6B and 7B are sectional views of the TFT array panel shown in FIGS. 4A, 5A, 6A and 7A taken along the lines IVB-VIB', VB-VB', VIB-VIB' and VIIB-VIIB';

FIGS. 13B and 13C are sectional views of the TFT array panel shown in FIG. 13A taken along the lines XIIIB-XIIIB' and XIIIC-XIIIC', respectively;

FIGS. 16A, 17A and 18A and FIGS. 16B, 17B and 18B are respective sectional views of the TFT array panel shown in FIG. 15A taken along the lines XVB-XVB' and XVC-XVC', respectively, and illustrate the steps following the step shown in FIGS. 15B and 15C;

FIGS. 20A, 21A and 22A and FIGS. 20B, 21B and 22B are respective sectional views of the TFT array panel shown in FIG. 19A taken along the lines XIXB-XIXB' and XIXC-XIXC', respectively, and illustrate the steps following the step shown in FIGS. 19B and 19C;

DETAILED DESCRIPTION OF EMBODIMENTS

Figure 1:
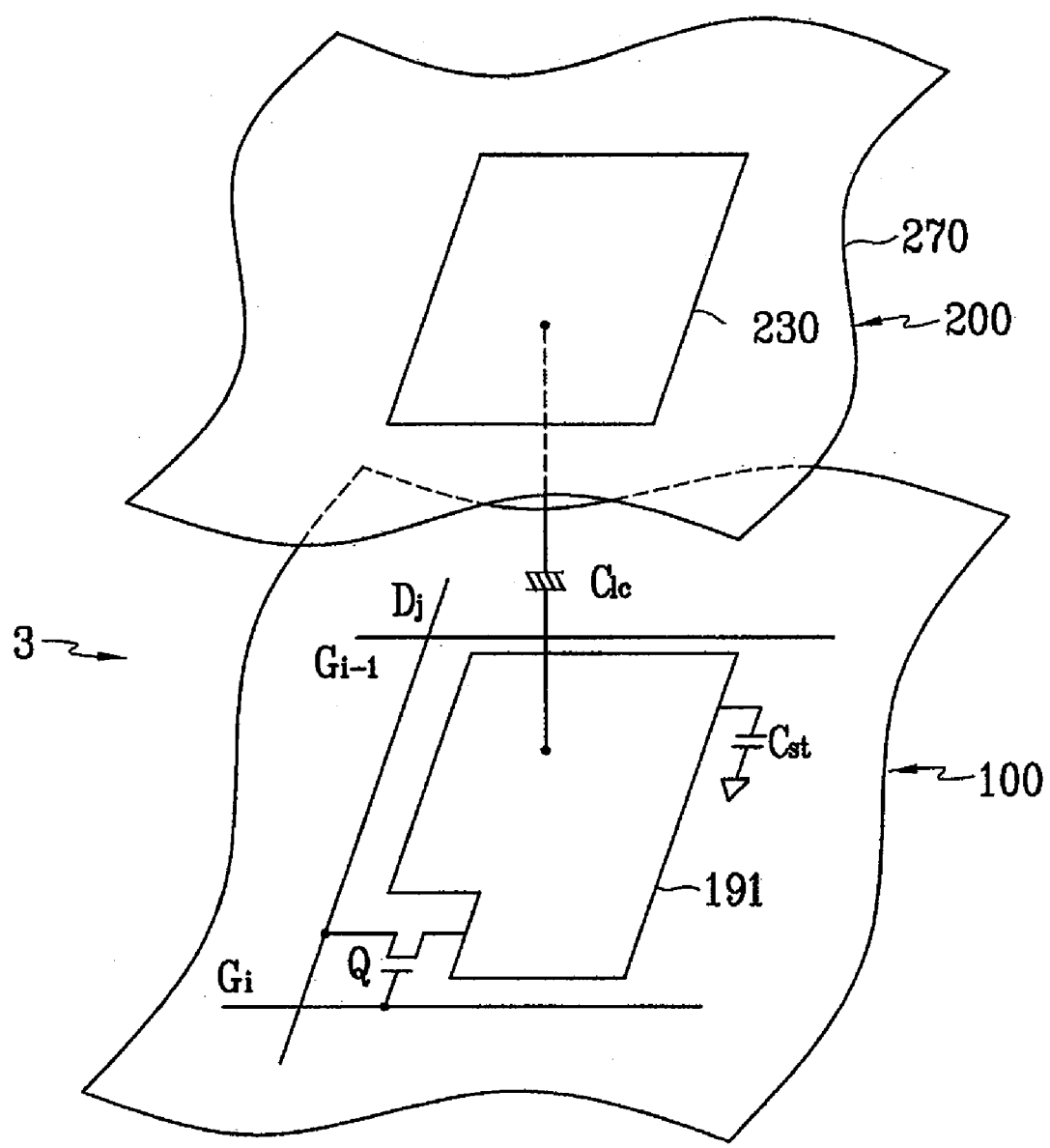
FIG. 1 is a schematic diagram of an LCD according to an embodiment of the present invention.

The present invention now will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films and regions are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Now, TFT array panels and manufacturing methods thereof according to embodiments of the present invention will be described with reference to the accompanying drawings.

FIG. 1 is a schematic diagram of an LCD according to an embodiment of the present invention.

Referring to FIG. 1, an LCD includes a pair of panels 100 and 200 and a liquid crystal layer 3 interposed therebetween. One panel 100 is called a "TFT array panel" including a plurality of TFTs Q, a plurality of pixel electrodes 190, a plurality of gate lines 121, and a plurality of data lines 171. Each pixel electrode 190 is connected to a pair of the gate lines 121 and the data lines 171 via at least one of the TFTs Q. The other panel 200 includes a common electrode 270 generating electric field in cooperation with the pixel electrodes 190, and a plurality of color filters 230 for color display. The pixel electrode 190 and the common electrode 270 act as a liquid crystal capacitor $C_{LC}$ with liquid crystal dielectric. The common electrode 270 may be provided on the TFT array panel 100, and then the pixel electrodes 190 and the common electrode 270 have shapes of bars or stripes.

A TFT array panel for an LCD will be described in detail with reference to FIGS. 2 and 3.

Figure 2:
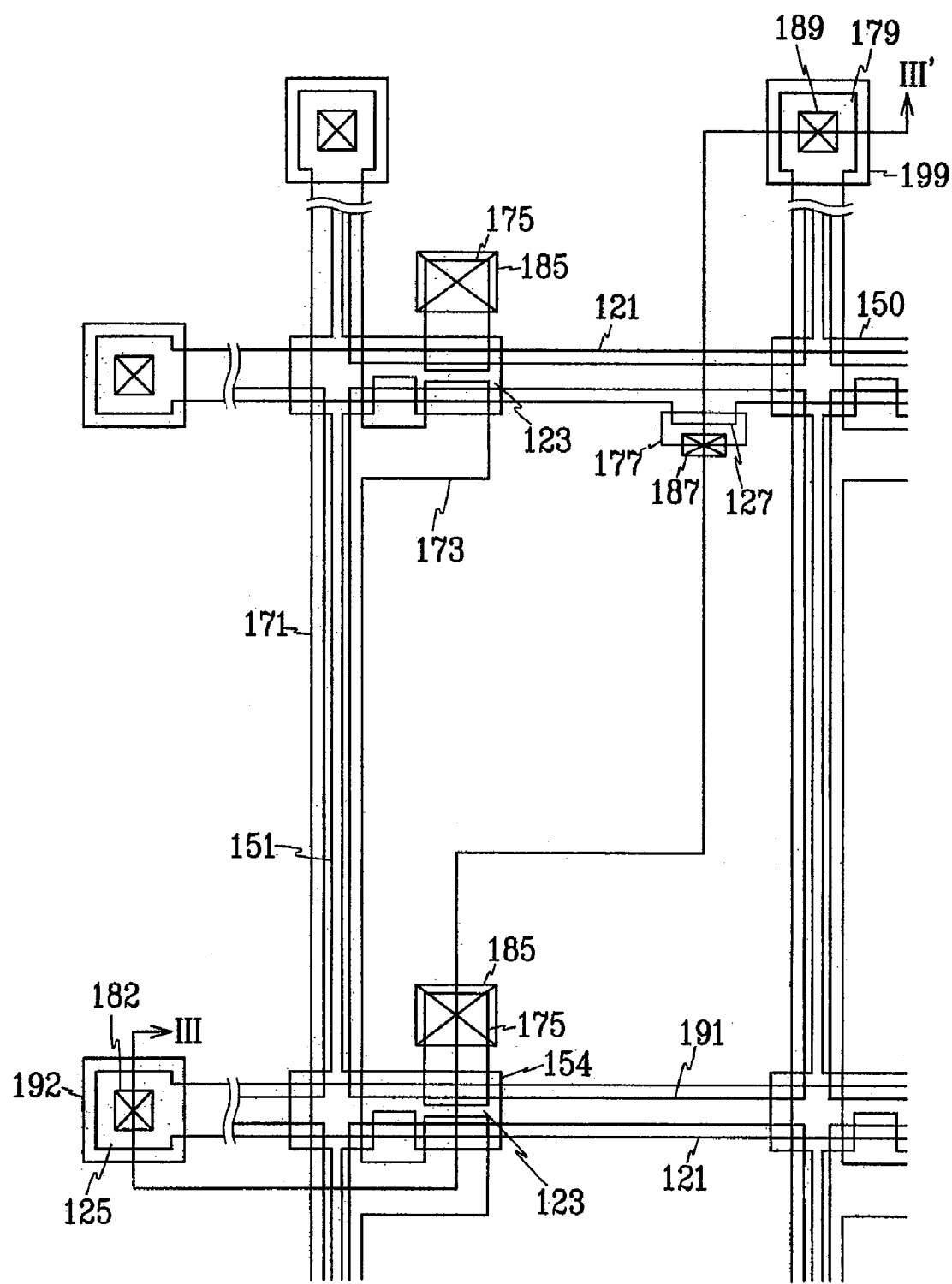
FIG. 2 is a layout view of an exemplary TFT array panel for an LCD according to an embodiment of the present invention.
Figure 3:
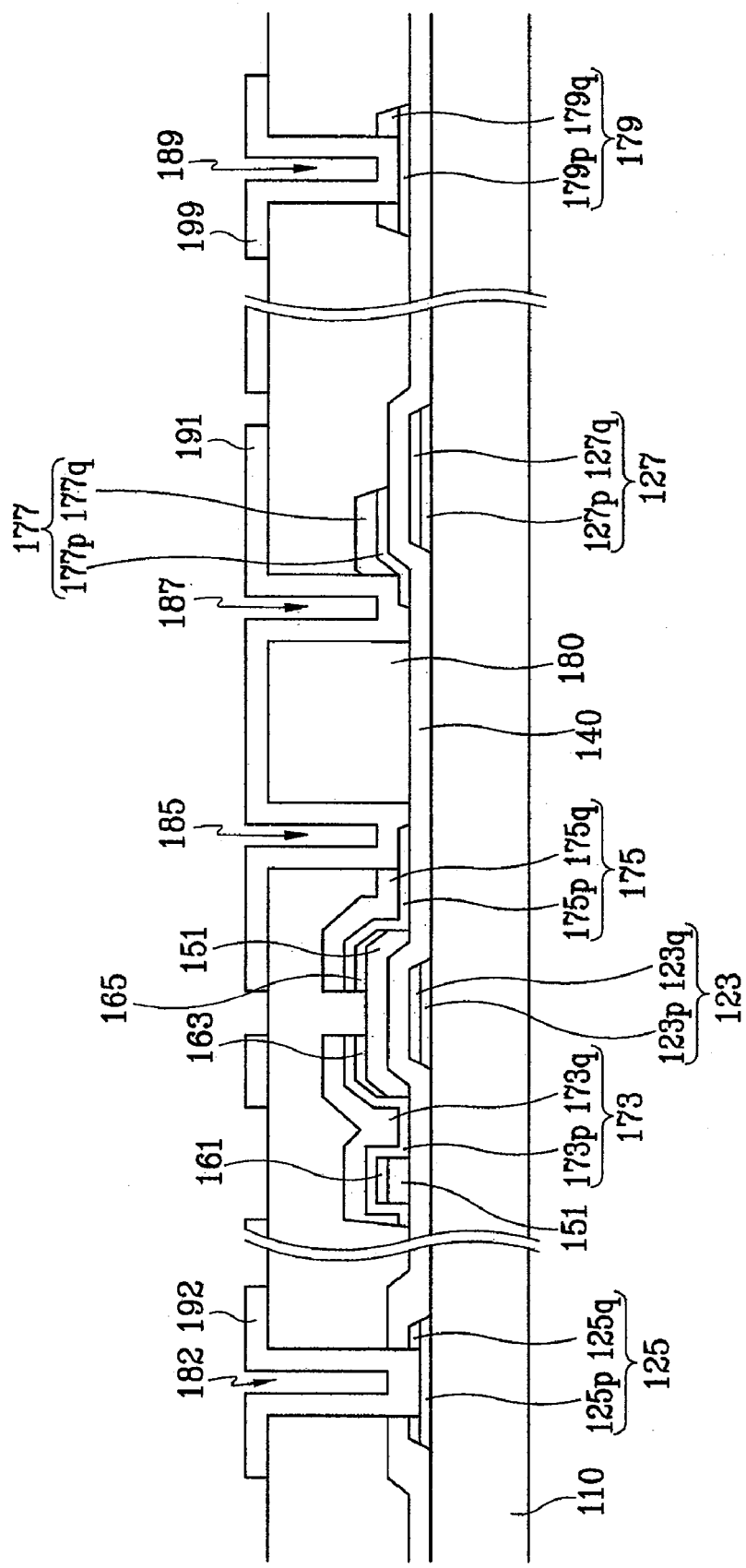
FIG. 3 is a sectional view of the TFT array panel shown in FIG. 1 taken along the line III-III'.

FIG. 2 is a layout view of an exemplary TFT array panel for an LCD according to an embodiment of the present invention, and FIG. 3 is a sectional view of the TFT array panel shown in FIG. 2 taken along the line III-III'.

A plurality of gate lines 121 for transmitting gate signals are formed on an insulating substrate 110. Each gate line 121 extends substantially in a transverse direction and a plurality of portions of each gate line 121 form a plurality of gate electrodes 123. Each gate line 121 includes a plurality of projections 127 protruding downward and an end portion 125 having wider width for contact with another layer or an external device.

The gate lines 121 include two films having different physical characteristics, a lower film 121p and an upper film 121q. The upper film 121q is preferably made of low resistivity metal including Al containing metal such as Al and Al alloy for reducing signal delay or voltage drop in the gate lines 121. On the other hand, the lower film 121p is 30 preferably made of material such as Cr, Mo, Mo alloy, Ta and Ti, which has good physical, chemical, and electrical contact characteristics with other materials such as indium tin oxide (ITO) and indium zinc oxide (IZO). A good exemplary combination of the lower film material and the upper film material is Cr and Al—Nd alloy. In FIG. 2, the lower and the upper films of the gate electrodes 123 are indicated by reference numerals 123p and 123q, respectively, the lower and the upper films of the projections 127 are indicated by reference numerals 127p and 127$q$, respectively, and the lower and the upper films of the end portions 125 are indicated by reference numerals 125$p$ and 125$q$, respectively.

A part of the upper film 125$q$ of the end portion 125 of each gate line 121 is removed to expose the underlying part of the lower film 125$p$ of the end portion 125. In addition, the lateral sides of the upper film 121$q$ and the lower film 121$p$ are tapered, and the inclination angle of the lateral sides with respect to a surface of the substrate 110 ranges about 30-80 degrees.

A gate insulating layer 140 preferably made of silicon nitride (SiNx) is formed on the gate lines 121.

A plurality of semiconductor stripes 151 preferably made of hydrogenated amorphous silicon (abbreviated to "a-Si") are formed on the gate insulating layer 140. Each semiconductor stripe 151 extends substantially in a longitudinal direction and has a plurality of projections 154 branched out toward the gate electrodes 123. The width of each semiconductor stripe 151 becomes large near the gate lines 121 such that the semiconductor stripe 151 covers large areas of the gate lines 121.

A plurality of ohmic contact stripes and islands 161 and 165 preferably made of silicide or n+ hydrogenated a-Si heavily doped with n type impurity are formed on the semiconductor stripes 151. Each ohmic contact stripe 161 has a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are tapered, and the inclination angles thereof are preferably in a range between about 30-80 degrees.

A plurality of data lines 171, a plurality of drain electrodes 175, and a plurality of storage capacitor conductors 177 are formed on the ohmic contacts 161 and 165 and the gate insulating layer 140.

The data lines 171 for transmitting data voltages extend substantially in the longitudinal direction and intersect the gate lines 121. A plurality of branches of each data line 171, which project toward the drain electrodes 175, form a plurality of source electrodes 173. Each pair of the source electrodes 173 and the drain electrodes 175 are separated from each other and opposite each other with respect to a gate electrode 123. A gate electrode 123, a source electrode 173, and a drain electrode 175 along with a projection 154 of a semiconductor stripe 151 form a TFT having a channel formed in the projection 154 disposed between the source electrode 173 and the drain electrode 175.

The storage capacitor conductors 177 overlap the projections 127 of the gate lines 121.

The data lines 171, the drain electrodes 175, and the storage capacitor conductors 177 also include a lower film 171$p$, 175$p$ and 177$p$ preferably made of Mo, Mo alloy or Cr and an upper film 171$q$, 175$q$ and 177$q$ located thereon and preferably made of Al containing metal. Each data line 171 includes an end portion 179 having wider width for contact with another layer or an external device, and a part of an upper film 179$q$ of the end portion 179 is removed to expose the underlying part of a lower film 179$p$ of the end portion 179.

Like the gate lines 121, the lower film 171$p$, 175$p$ and 177$p$ and the upper film 171$q$, 175$q$ and 177$q$ of the data lines 171, the drain electrodes 175, and the storage capacitor conductors 177 have tapered lateral sides, and the inclination angles thereof range about 30-80 degrees.

The ohmic contacts 161 and 165 are interposed only between the underlying semiconductor stripes 151 and the overlying data lines 171 and the overlying drain electrodes 175 thereon and reduce the contact resistance therebetween. The semiconductor stripes 151 include a plurality of exposed portions, which are not covered with the data lines 171 and the drain electrodes 175, such as portions located between the source electrodes 173 and the drain electrodes 175. Although the semiconductor stripes 151 are narrower than the data lines 171 at most places, the width of the semiconductor stripes 151 becomes large near the gate lines as described above, to enhance the insulation between the gate lines 121 and the data lines 171.

A passivation layer 180 is formed on the data lines 171, the drain electrodes 175, the storage conductors 177, and the exposed portions of the semiconductor stripes 151. The passivation layer 180 is preferably made of photosensitive organic material having a good flatness characteristic, low dielectric insulating material such as a-Si:C:O and a-Si:O:F formed by plasma enhanced chemical vapor deposition (PECVD), or inorganic material such as silicon nitride.

The passivation layer 180 has a plurality of contact holes 185, 187 and 189 exposing the lower films 175$p$ of the drain electrodes 175, the lower films 177$p$ of the storage conductors 177, and the lower films 179$p$ of the end portions 179 of the data lines 171, respectively. The passivation layer 180 and the gate insulating layer 140 have a plurality of contact holes 182 exposing the lower films 125$p$ of the end portions 125 of the gate lines 121.

In addition, FIGS. 2 and 3 shows that the contact holes 185 and 187 expose edges of the lower films 175$p$ and 177$p$ and some portions of the gate insulating layer 140. The size of each contact hole 185 is preferably smaller than 10×10 square microns and equal to or larger than 4×4 square microns. The contact holes 182 and 189 may expose at least one edge of the end portions 125 and 179 and they may be larger than the contact holes 185 for reducing contact resistance.

A plurality of pixel electrodes 191 and a plurality of contact assistants 192 and 199, which are preferably made of ITO or IZO, are formed on the passivation layer 180.

The pixel electrodes 191 are physically and electrically connected to the drain electrodes 175 through the contact holes 185 and to the storage capacitor conductors 177 through the contact holes 187 such that the pixel electrodes 191 receive the data voltages from the drain electrodes 175 and transmit the received data voltages to the storage capacitor conductors 177.

Referring back to FIG. 1, the pixel electrodes 191 supplied with the data voltages generate electric fields in cooperation with the common electrode 270 on the other panel 200, which reorient liquid crystal molecules in the liquid crystal layer 3 disposed therebetween.

As described above, a pixel electrode 191 and a common electrode 270 form a liquid crystal capacitor $C_{LC}$, which stores applied voltages after turn-off of the TFT Q. An additional capacitor called a "storage capacitor," which is connected in parallel to the liquid crystal capacitor $C_{LC}$, is provided for enhancing the voltage storing capacity. The storage capacitors are implemented by overlapping the pixel electrodes 191 with the gate lines 121 adjacent thereto (called "previous gate lines"). The capacitances of the storage capacitors, i.e., the storage capacitances are increased by providing the projections 127 at the gate lines 121 for increasing overlapping areas and by providing the storage capacitor conductors 177, which are connected to the pixel electrodes 191 and overlap the projections 127, under the pixel electrodes 191 for decreasing the distance between the terminals.

The pixel electrodes 191 overlap the gate lines 121 and the data lines 171 to increase aperture ratio but it is optional.

The contact assistants 192 and 199 are connected to the exposed end portions 125 of the gate lines 121 and the exposed end portions 179 of the data lines 171 through the contact holes 182 and 189, respectively. The contact assistants 192 and 199 are not requisites but preferred to protect the exposed portions 125 and 179 and to complement the adhesiveness of the exposed portions 125 and 179 and external devices.

As described above, the lower films 125p, 179p, 175p and 177p of the end portions 125 of the gate lines 121, the end portions 179 of the data lines 171, the drain electrodes 175, and the storage capacitor conductors 177, which have a good contact characteristic with ITO and IZO are exposed, and the contact holes 185 and 187 expose at least an edge of the lower films 175p and 177p. Accordingly, the pixel electrodes 191 and the contact assistants 192 and 199 are in contact with the lower films 175p, 177p, 125p and 179p with sufficiently large contact areas to provide low contact resistance.

According to another embodiment of the present invention, the pixel electrodes 191 are made of transparent conductive polymer. For a reflective LCD, the pixel electrodes 191 are made of opaque reflective metal. In these cases, the contact assistants 192 and 199 may be made of material such as ITO or IZO different from the pixel electrodes 191.

A method of manufacturing the TFT array panel shown in FIGS. 2 and 3 according to an embodiment of the present invention will be now described in detail with reference to FIGS. 4A to 9 as well as FIGS. 2 and 3.

Figure 8:
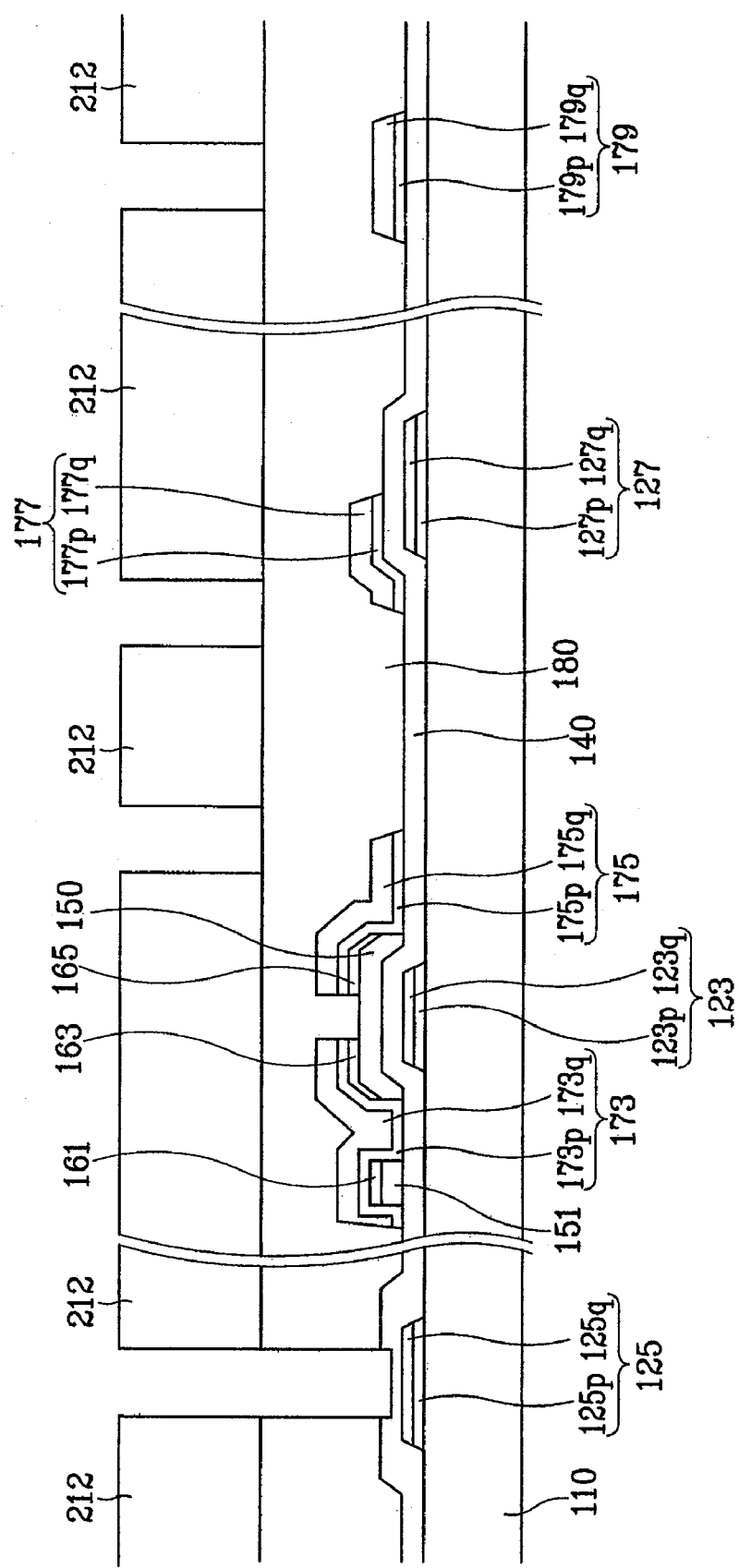
FIGS. 8 and 9 are sectional views of the TFT array panel shown in FIG. 7A in the steps of the manufacturing method following the step shown in FIGS. 7A and 7B.
Figure 9:
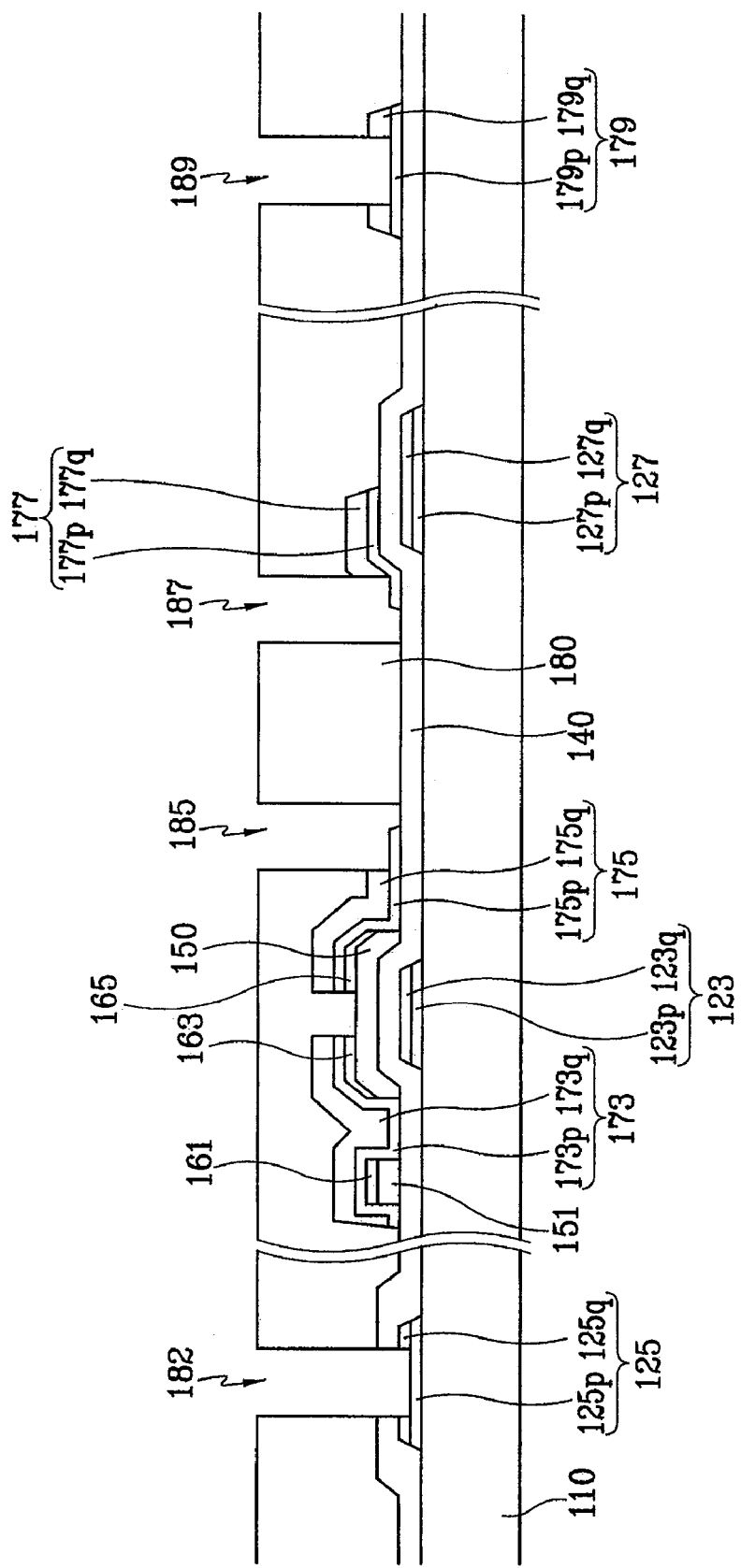

FIGS. 4A, 5A, 6A and 7A are layout views of the TFT array panel shown in FIGS. 2 and 3 in intermediate steps of a manufacturing method thereof according to an embodiment of the present invention, and FIGS. 4B, 5B, 6B and 7B are sectional views of the TFT array panel shown in FIGS. 4A, 5A, 6A and 7A taken along the lines IVB-VIB', VB-VB', VIB-VIB' and VIIB-VIIB', respectively. FIGS. 8 and 9 are sectional views of the TFT array panel shown in FIG. 7A in the steps of the manufacturing method following the step shown in FIGS. 7A and 7B.

Two conductive films, a lower conductive film and an upper conductive film are sputtered in sequence on an insulating substrate 110 such as transparent glass. The upper conductive film is preferably made of Al containing metal such as Al—Nd alloy. An Al—Nd target for sputtering the upper film preferably contains 2 atm % and the upper film preferably has a thickness of about 2,500 Å.

Figure 4A:
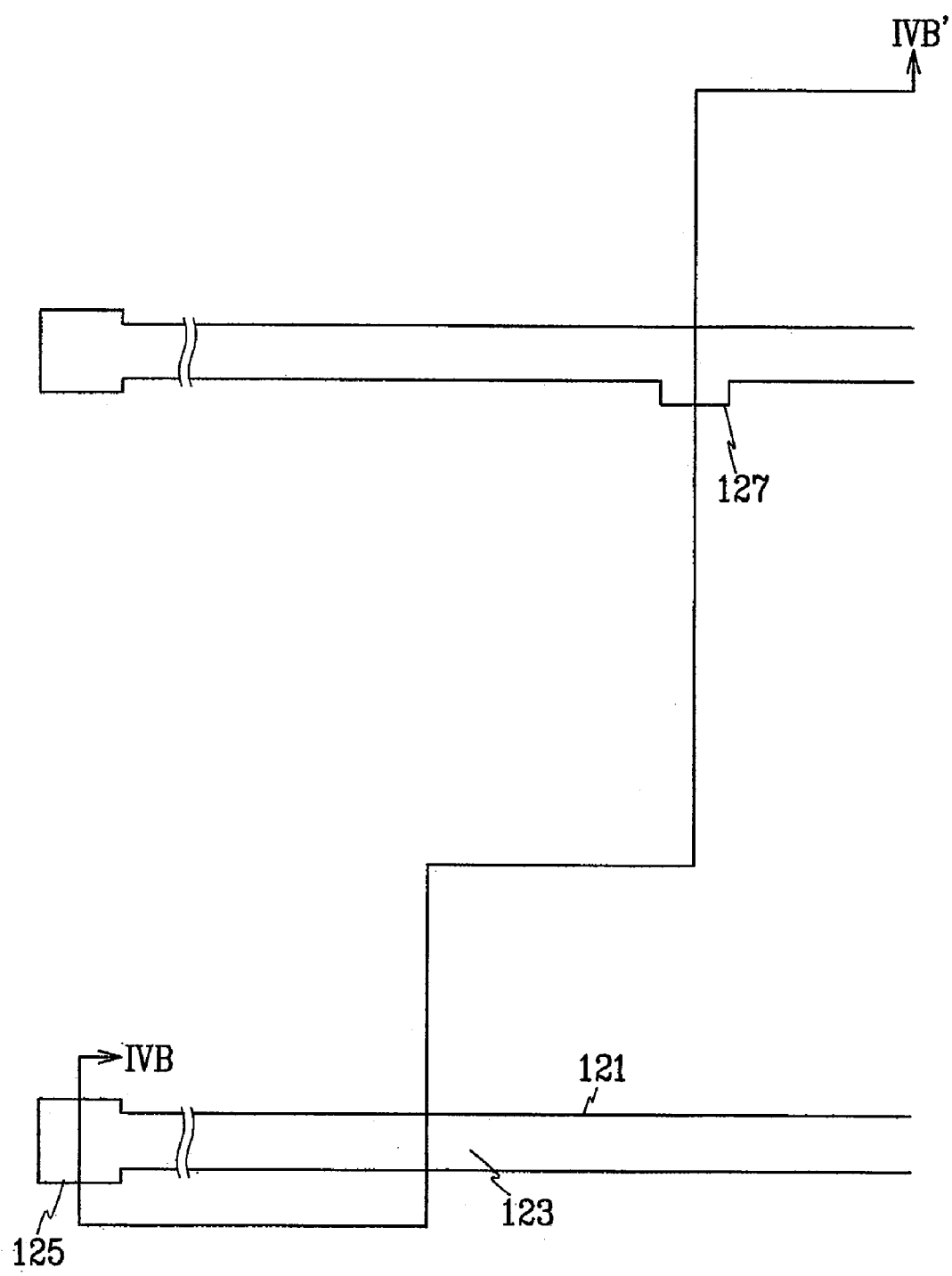
FIGS. 4A, 5A, 6A and 7A are layout views of the TFT array panel shown in FIGS. 2 and 3 in intermediate steps of a manufacturing method thereof according to an embodiment of the present invention.

Referring to FIGS. 4A and 4B, the upper conductive film and the lower conductive film are patterned in sequence to form a plurality of gate lines 121 including a plurality of gate electrodes 123 and a plurality of projections 127.

Figure 5A:
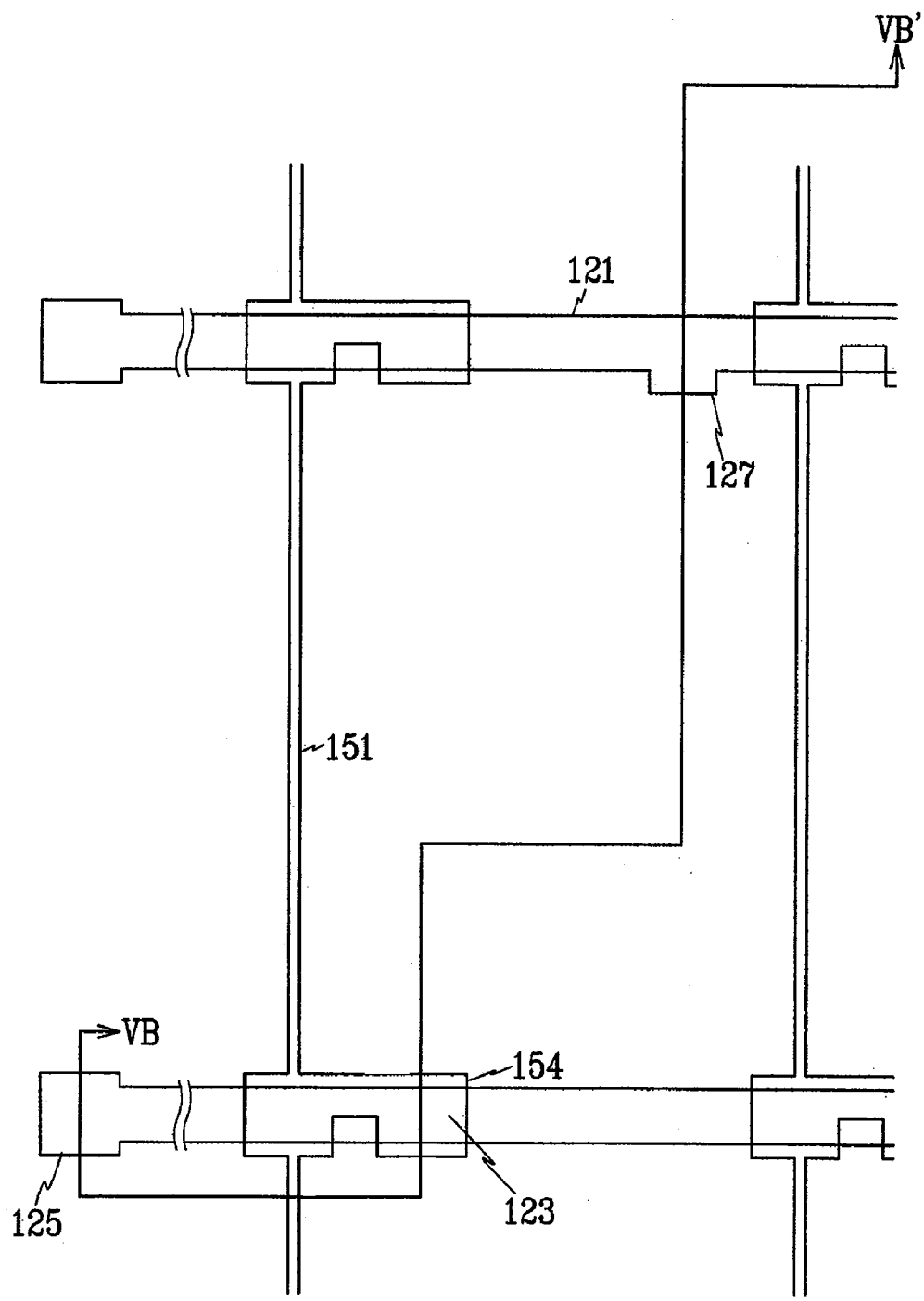

Referring to FIGS. 5A and 5B, after sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductor stripes 164 and a plurality of intrinsic semiconductor stripes 151 including a plurality of projections 154 on the gate insulating layer 140. The gate insulating layer 140 is preferably made of silicon nitride with thickness of about 2,000 Å to about 5,000 Å, and the deposition temperature is preferably in a range between about 250° C. and about 500° C.

Two conductive films, a lower conductive film and an upper conductive film are sputtered in sequence. The lower conductive film is preferably made of Mo, Mo alloy or Cr, and preferably has a thickness of about 500 Å. It is preferable that the upper conductive film has a thickness of about 2,500 Å, the sputtering target for the upper conductive film includes pure Al or Al—Nd containing 2 atomic % Nd, and the sputtering temperature is about 150° C.

Figure 6A:
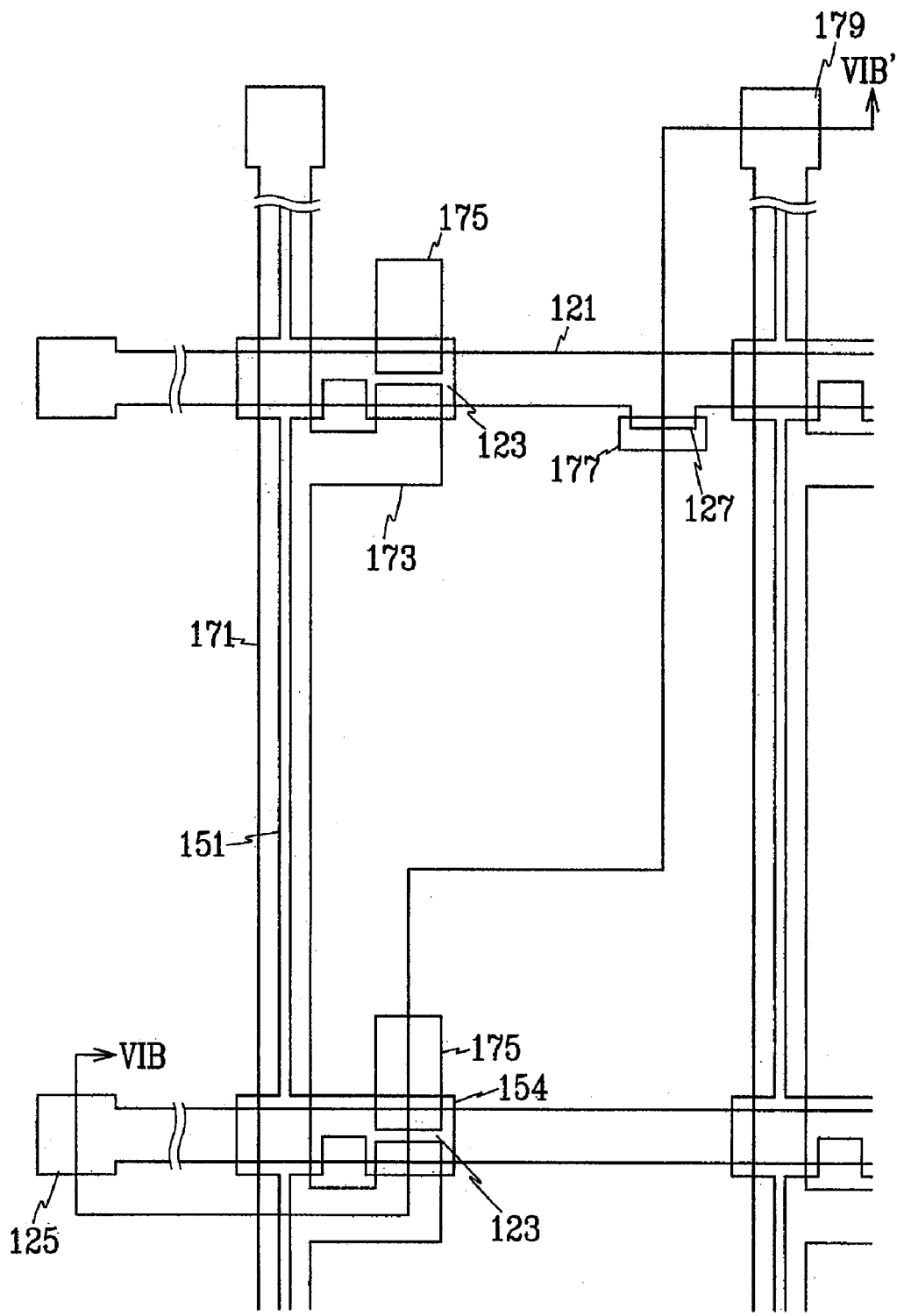
Figure 6B:
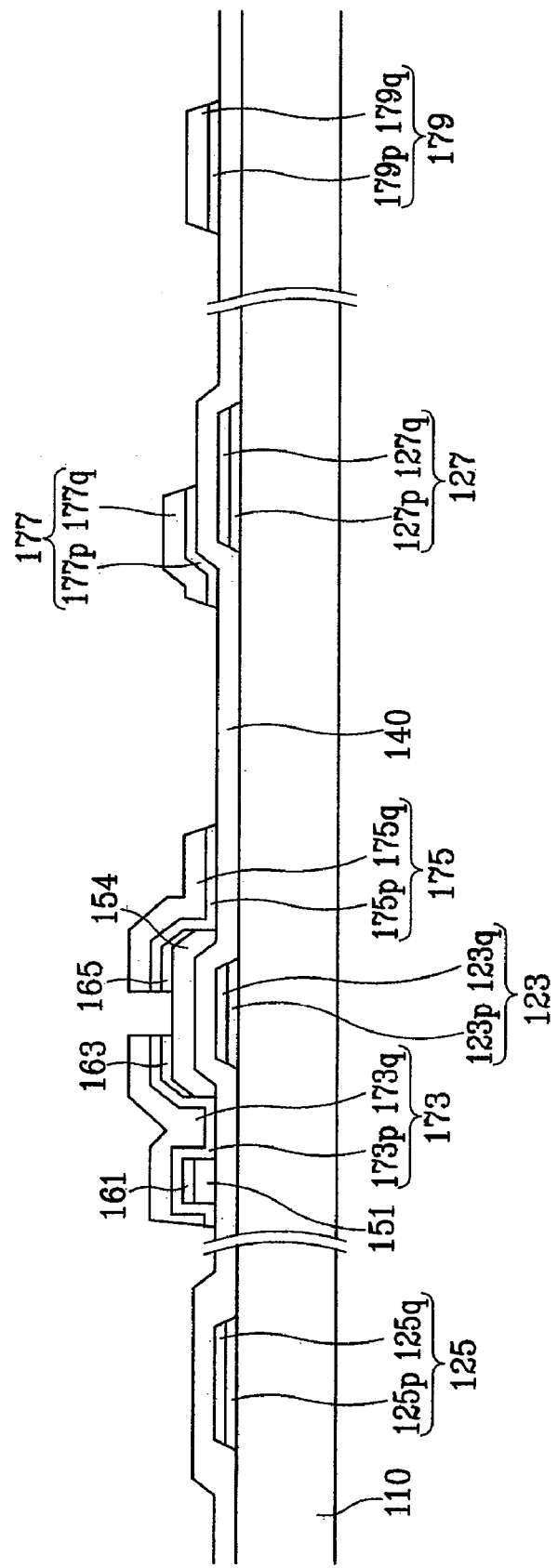

Referring to FIGS. 6A and 6B, the upper conductive film and the lower conductive film are wet-etched and dry-etched, respectively, or both the films are wet etched to form a plurality of data lines 171 including a plurality of source electrodes 173, a plurality of drain electrodes 175, and a plurality of storage capacitor conductors 177. When the lower film is made of Mo or Mo alloy, the upper and the lower layers can be etched under the same etching conditions.

Thereafter, portions of the extrinsic semiconductor stripes 164, which are not covered with the data lines 171, the drain electrodes 175, and the storage capacitor conductors 177, are removed to complete a plurality of ohmic contact stripes 161 including a plurality of projections 163 and a plurality of ohmic contact islands 165 and to expose portions of the intrinsic semiconductor stripes 151. Oxygen plasma treatment preferably follows thereafter in order to stabilize the exposed surfaces of the semiconductor stripes 151.

Figure 7A:
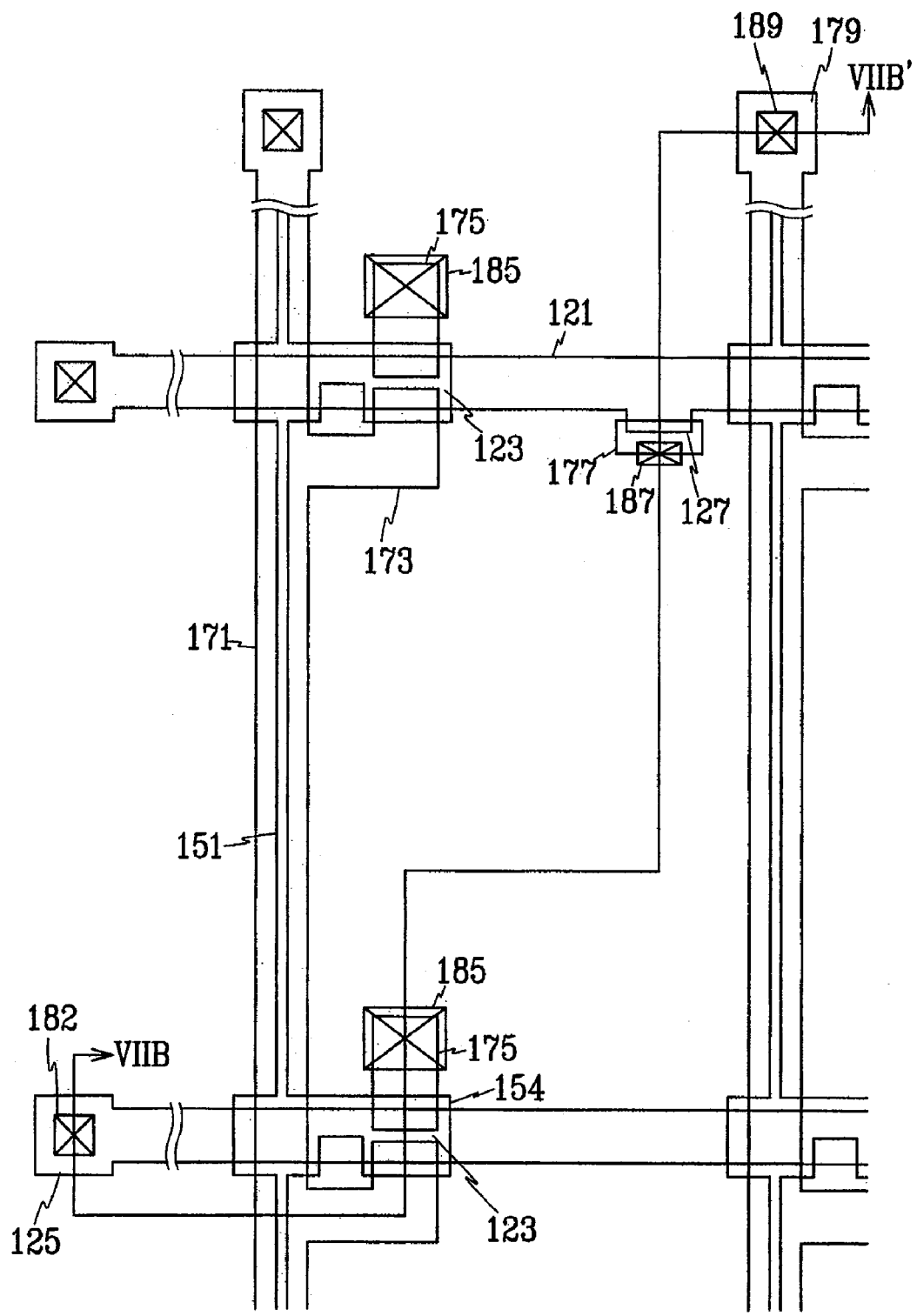
Figure 7B:
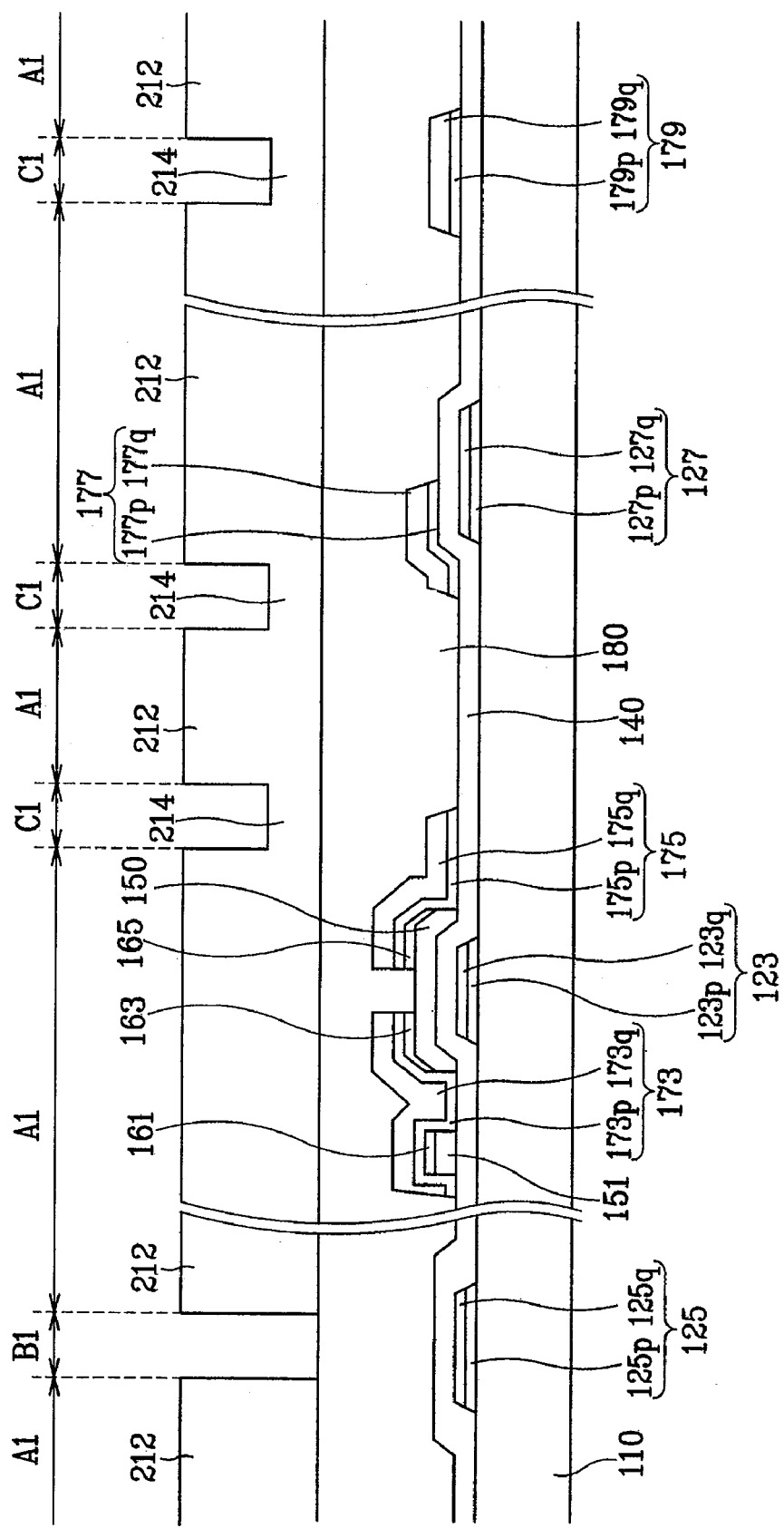

As shown in FIGS. 7A and 7B, after depositing a passivation layer 180, a photoresist film is spin-coated on the passivation layer 180. The photoresist film is exposed to light through an exposure mask (not shown), and developed such that the developed photoresist has a position dependent thickness. The photoresist shown in FIG. 7B includes a plurality of first to third portions with decreased thickness. The first portions in areas A1 and the second portions in active contact areas C1 located on portions of the drain electrodes 175 and the storage capacitor conductors 177 are indicated by reference numerals 212 and 214, respectively, and no reference numeral is assigned to the third portions in peripheral contact areas B1 located on the end portions 125 of the gate lines 121 since they have substantially zero thickness to expose underlying portions of the passivation layer 180. The portions 214 located on the end portions 179 of the data lines 179 may have the same thickness as the third portions. The thickness ratio of the second portions 214 to the first portions 212 is adjusted depending upon the process conditions in the subsequent process steps. It is preferable that the thickness of the second portions 214 is equal to or less than the thickness of the passivation layer 180.

The position-dependent thickness of the photoresist is obtained by several techniques, for example, by providing translucent areas on the exposure mask as well as transparent areas and light blocking opaque areas. The translucent areas may have a slit pattern, a lattice pattern, a thin film(s) with intermediate transmittance or intermediate thickness. When using a slit pattern, it is preferable that the width of the slits or the distance between the slits is smaller than the resolution of a light exposer used for the photolithography. Another example is to use reflowable photoresist. In detail, once a photoresist pattern made of a reflowable material is formed by using a normal exposure mask only with transparent areas and opaque areas, it is subject to reflow process to flow onto areas without the photoresist, thereby forming thin portions.

The different thickness of the photoresist 212 and 214 enables to selectively etch the underlying layers when using suitable process conditions. Therefore, a plurality of contact holes 182, 185, 187 and 189 having different height are obtained.

For descriptive purpose, portions on the areas A1 are called first portions, portions of the passivation layer 180, the drain electrodes 175, the storage capacitor conductors 177, the data lines 171, and the gate insulating layer 140 on the active contact areas C1 are called second portions, and portions of the passivation layer 180, the gate insulating layer 140, and the gate lines 121 on the peripheral contact areas B1 are called third portions.

An exemplary sequence of forming such a structure is as follows:

As shown in FIG. 8, the exposed third portions of the passivation layer 180 on the peripheral contact areas B1 are removed by dry etching, preferably under the condition that the etching ratios for the passivation layer 180 and the photoresist 212 and 214 are substantially equal such that the second portions 214 of the photoresist can be also removed or can be remained with reduced thickness for next etching step. Although the dry etching may etch out the top portions of the second portions of the passivation layer 180 and the third portions of the gate insulating layer 140, it is preferable that the thickness of the third portions of the gate insulating layer 140 is smaller than that of the second portions of the passivation layer 180 so that the second portions of the gate insulating layer 140 may not be removed in later steps. Residue of the second portions 214 of the photoresist remained on the active contact areas C1 is removed by ashing to completely expose the second portions of the passivation layer 180.

Referring to FIG. 9, the third portions of the gate insulating layer 140 and the second portions of the passivation layer 180 are removed to complete the contact holes 182, 185, 187 and 189. The removal of those portions is performed by dry etching under the condition that the etching ratios for the gate insulating layer 140 and the passivation layer 180 are substantially equal. Since the thickness of the third portions of the gate insulating layer 140 is smaller than that of the second portions of the passivation layer 180, the third portions of the gate insulating layer 140 and the second portions of the passivation insulating layer 180 are completely removed, and simultaneously, the second portions of the gate insulating layer 140 remain to prevent the undercut of the gate insulating layer 140 under the drain electrodes 175 and the storage capacitor conductors 177.

Subsequently, the third portions of the upper film 125q of the end portions 125 of the gate lines 121 and the second portions of the upper films 175q, 177q and 179q of the drain electrodes 175, the storage capacitor conductors 177, and the end portions 179 of the data lines 171 are removed to expose the underlying lower films 125p, 175q, 177p and 179p.

Finally, as shown in FIGS. 2 and 3, a plurality of pixel electrodes 191 and a plurality of contact assistants 192 and 199 are formed on the passivation layer 180 by sputtering and photo-etching an ITO or IZO layer. Since there is no undercut under the drain electrodes 175 and the storage capacitor conductors 177, the profile of the pixel electrodes 179 becomes smooth. In addition, since the pixel electrodes 191 and the contact assistants 192 and 199 are in contact with the lower films 175p and 177p of the drain electrodes 175 and the storage capacitor conductors 177 and the lower films 125p and 179p of the gate lines 121 and the data lines 171, which have good contact characteristics with ITO and IZO, the contact resistance at contact portions is reduced.

In the TFT array panel according to an embodiment of the present invention, the gate lines 121 and the data lines 171 include Al or Al alloy with low resistivity while they have minimized contact resistance between the pixel electrodes 191.

A TFT array panel for an LCD according to another embodiment of the present invention will be described in detail with reference to FIGS. 10-12.

Figure 10:
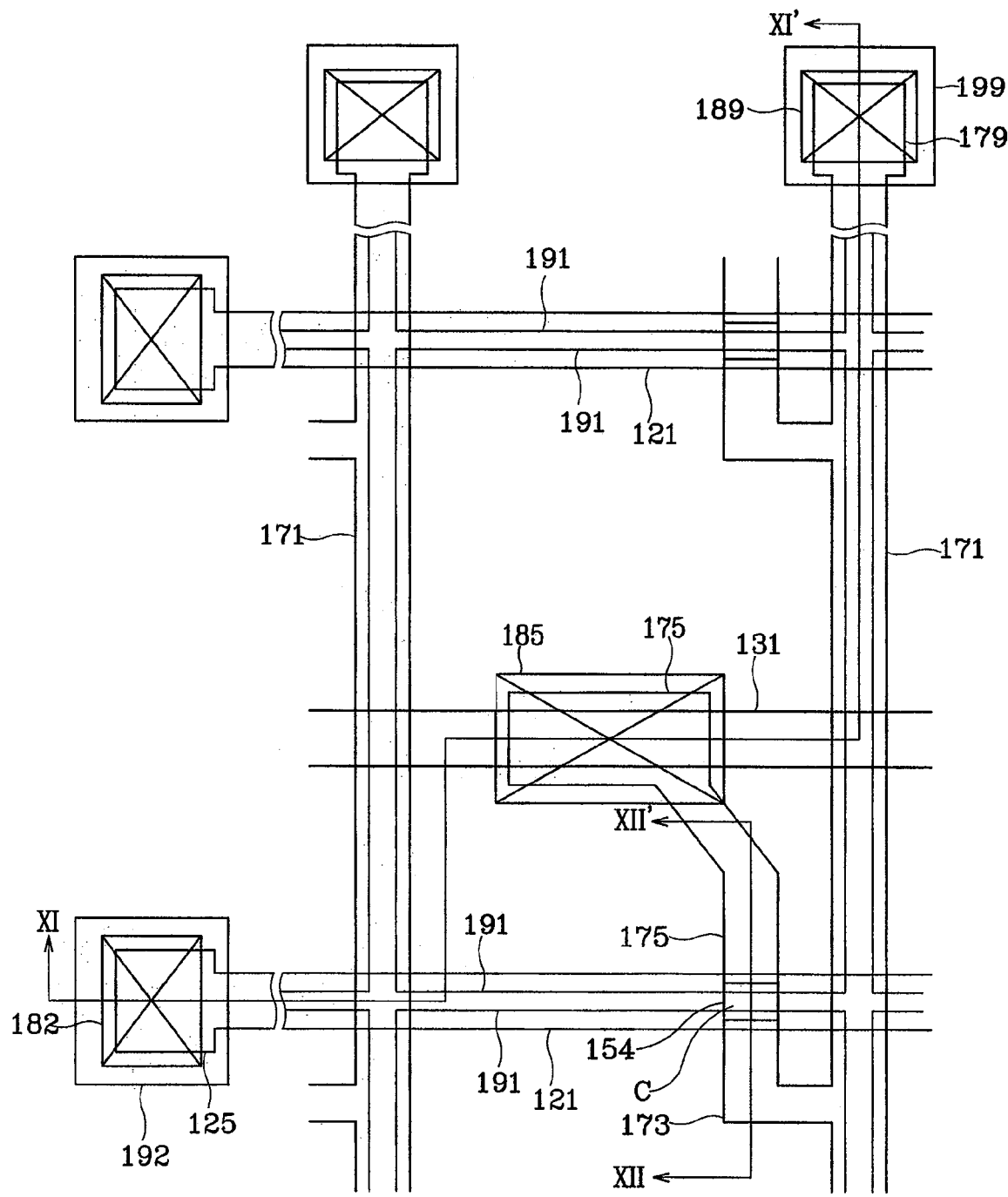
FIG. 10 is a layout view of an exemplary TFT array panel for an LCD according to another embodiment of the present invention.
Figure 11:
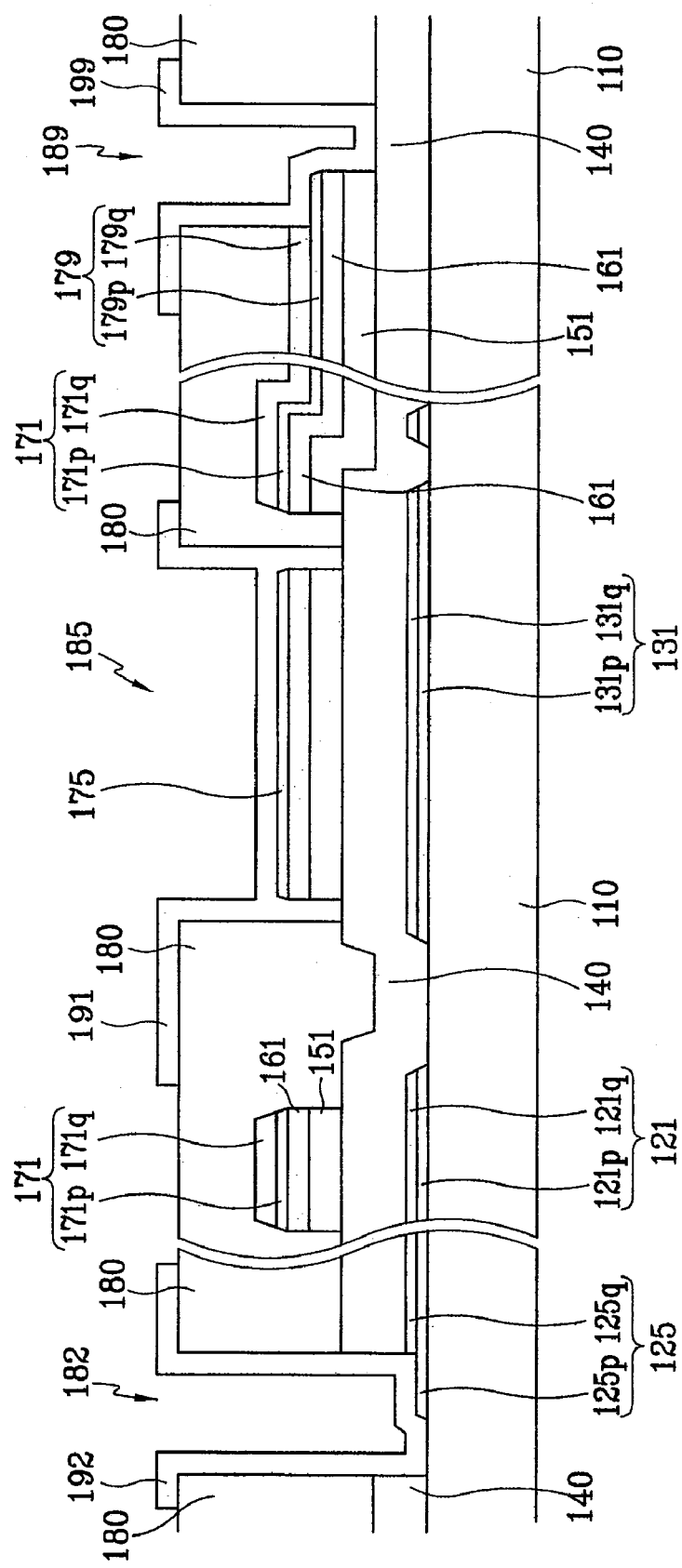
FIGS. 11 and 12 are sectional views of the TFT array panel shown in FIG. 10 taken along the line XI-XI' and the line XII-XII', respectively.
Figure 12:
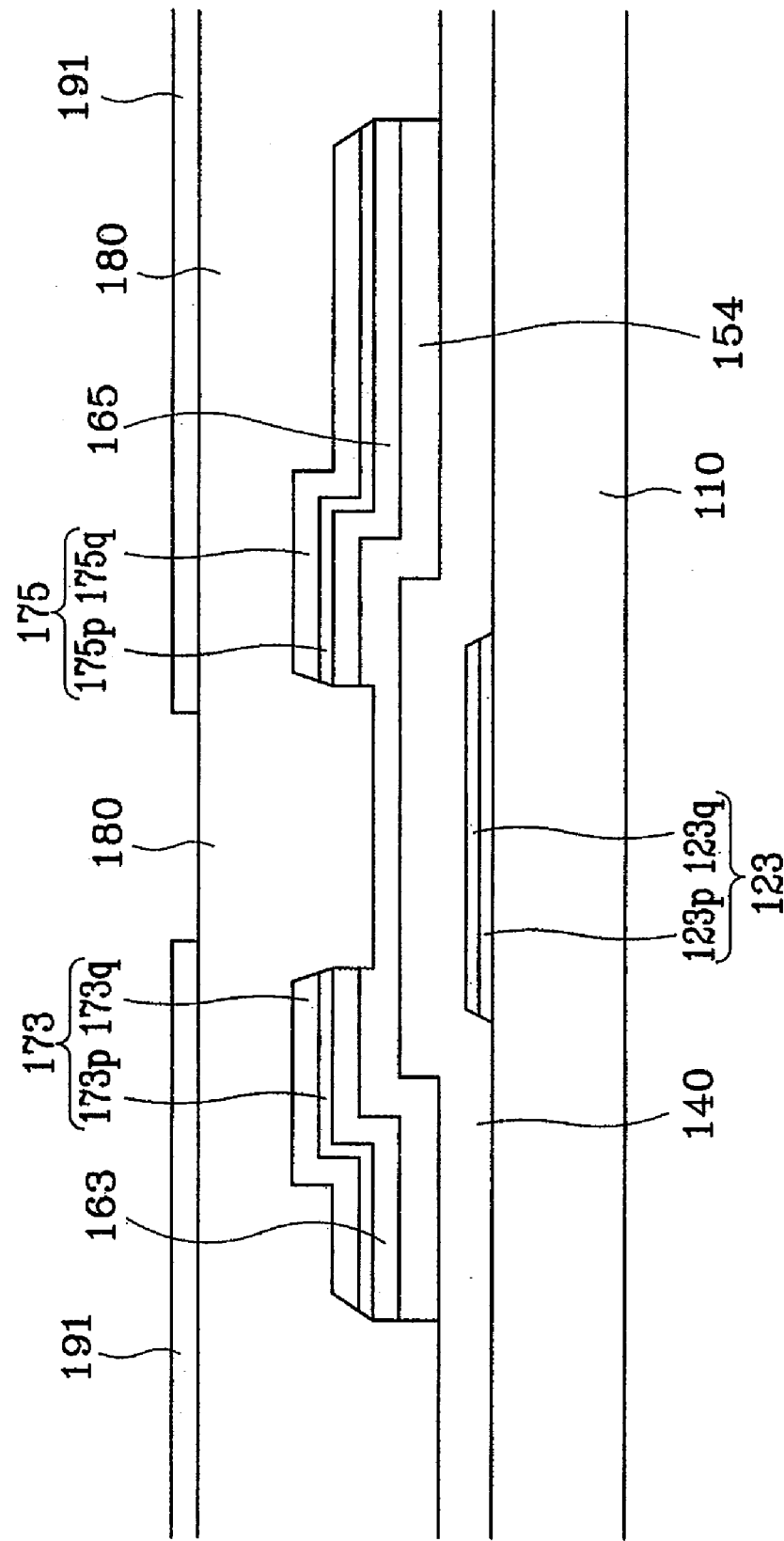

FIG. 10 is a layout view of an exemplary TFT array panel for an LCD according to another embodiment of the present invention, and FIGS. 11 and 12 are sectional views of the TFT array panel shown in FIG. 10 taken along the line XI-XI' and the line XII-XII', respectively.

As shown in FIGS. 10-12, a layered structure of a TFT array panel of an LCD according to this embodiment is almost the same as that shown in FIGS. 2 and 3. That is, a plurality of gate lines 121 including a plurality of gate electrodes 123 are formed on a substrate 110, and a gate insulating layer 140, a plurality of semiconductor stripes 151 including a plurality of projections 154, and a plurality of ohmic contact stripes 161 including a plurality of projections 163 and a plurality of ohmic contact islands 165 are sequentially formed thereon. A plurality of data lines 171 including a plurality of source electrodes 173 and a plurality of drain electrodes 175 are formed on the ohmic contacts 161 and 165, and a passivation layer 180 is formed thereon. A plurality of contact holes 182, 185 and 189 are provided at the passivation layer 180 and/or the gate insulating layer 140, and a plurality of pixel electrodes 191 and a plurality of contact assistants 192 and 199 are formed on the passivation layer 180.

Different from the TFT array panel shown in FIGS. 2 and 3, the TFT array panel according to this embodiment provides a plurality of storage electrode lines 131, which are separated from the gate lines 121, on the same layer as the gate lines 121 without projections. The storage electrode lines 131 include, like the gate lines 121, a lower film 131p and an upper film 131q and the edges of the upper film 131q lie within the edges of the lower film 131p with maintaining a uniform distance therefrom. The storage electrode lines 131 are supplied with a predetermined voltage such as the common voltage. Without providing the storage capacitor conductors 177 shown in FIGS. 2 and 3, the drain electrodes 175 extend to overlap the storage electrode lines 131 to form storage capacitors. The storage electrode lines 131 may be omitted if the storage capacitance generated by the overlapping of the gate lines 121 and the pixel electrodes 191 is sufficient.

Furthermore, the contact holes 182 and 189 exposes edges of end portions 125 and 179 of the gate lines 121 and the data lines 175 to secure good contacts between the end portions 125 and 179 and the contact assistants 192 and 199.

In addition, as well as the semiconductor stripes 151 and the ohmic contacts 161 and 165, a plurality of semiconductor islands 157 and a plurality of ohmic contacts 167 thereover are provided between the storage conductors 177 and the gate insulating layer 140.

The semiconductor stripes and islands 151 and 157 have almost the same planar shapes as the data lines 171, the drain electrodes 175 and the storage capacitor conductors 177 as well as the underlying ohmic contacts 161, 165 and 167, except for the projections 154 where TFTs are provided. In particular, the semiconductor islands 157, the ohmic contact islands 167 and the storage conductors 177 have substantially the same planar shape. The semiconductor stripes 151 include some exposed portions, which are not covered with the data lines 171, the drain electrodes 175 and the storage conductors 177, such as portions located between the source electrodes 173 and the drain electrodes 175.

Now, a method of manufacturing the TFT array panel shown in FIGS. 10-12 according to an embodiment of the present invention will be described in detail with reference to FIGS. 13A-22B as well as FIGS. 10-12.

Figure 13A:
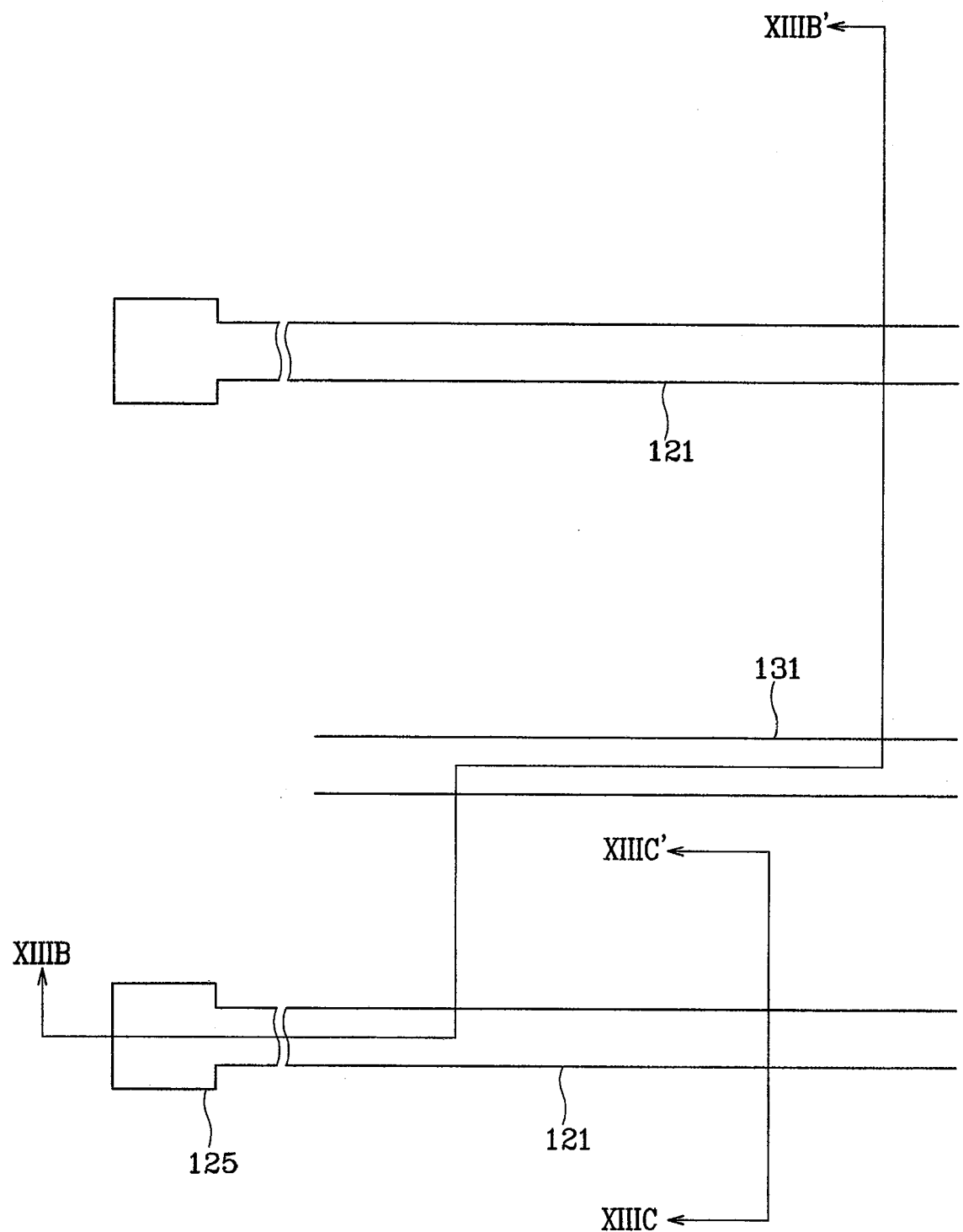
FIG. 13A is a layout view of a TFT array panel shown in FIGS. 10-12 in the first step of a manufacturing method thereof according to an embodiment of the present invention.
Figure 13B:
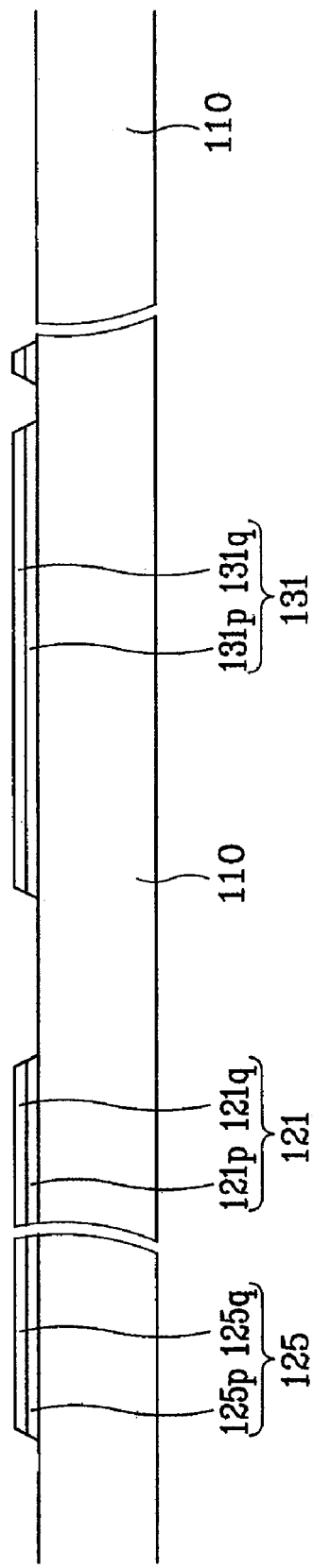
Figure 14A:
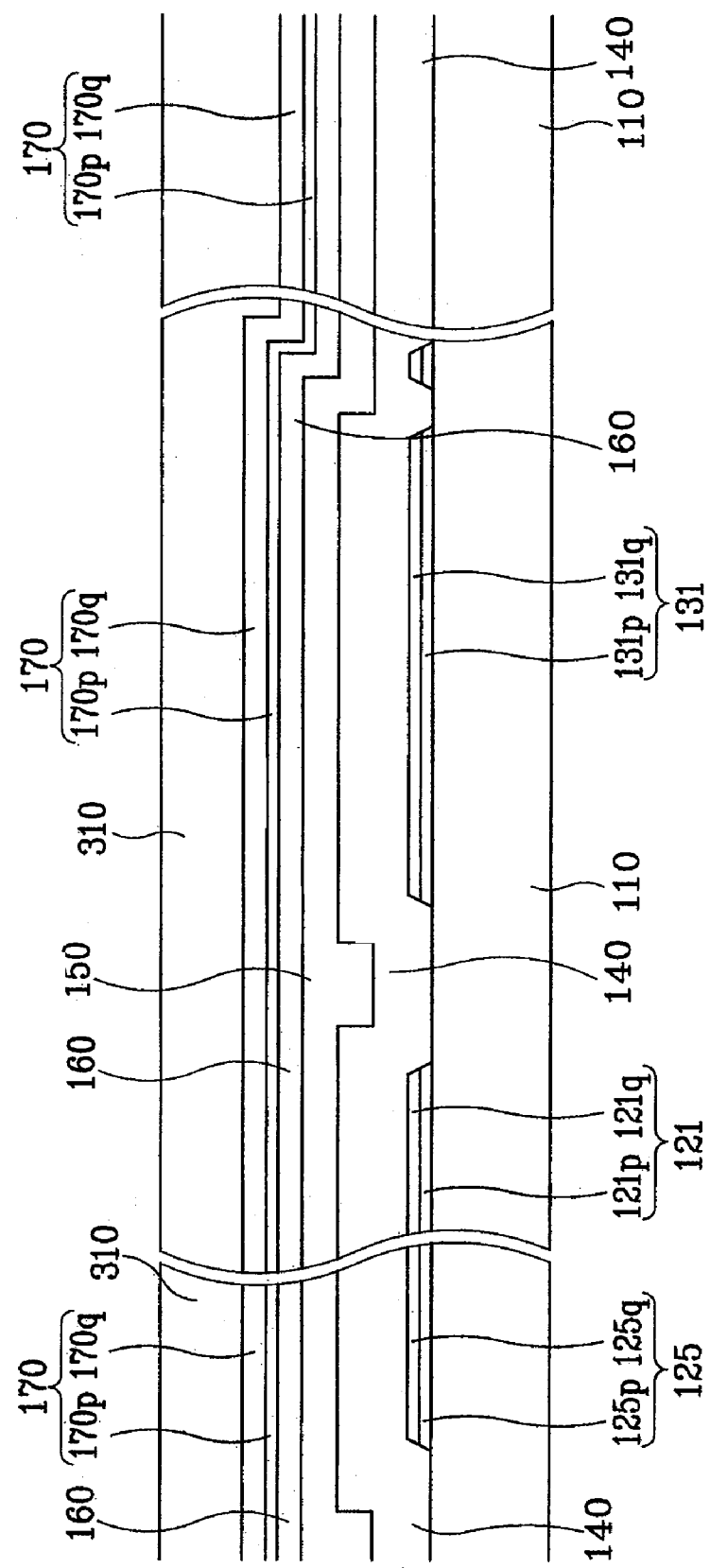
FIGS. 14A and 14B are sectional views of the TFT array panel shown in FIG. 13A taken along the lines XIIIB-XIIIB' and XIIIC-XIIIC', respectively, and illustrate the step following the step shown in FIGS. 13B and 13C.
Figure 14B:
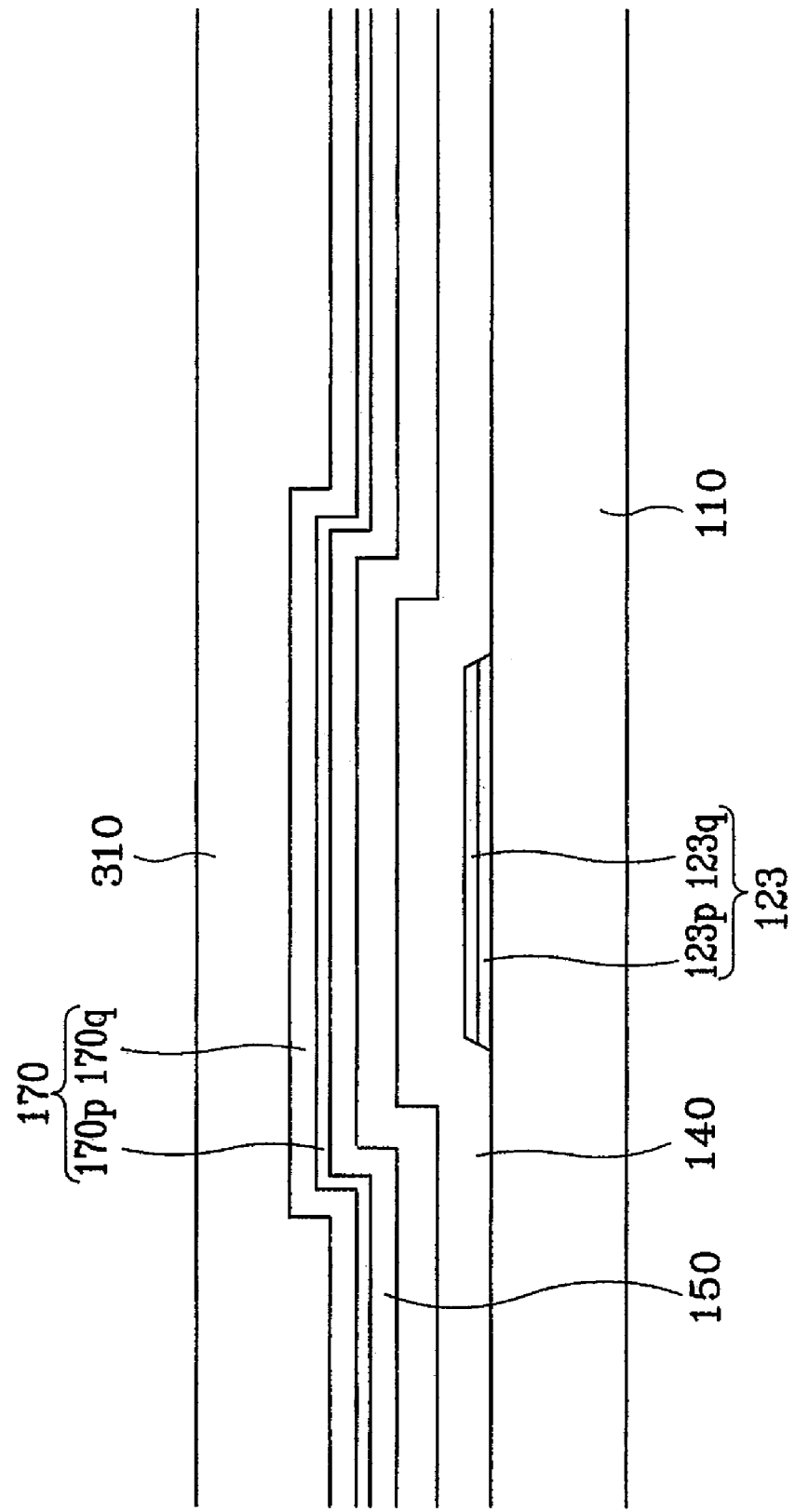
Figure 15A:
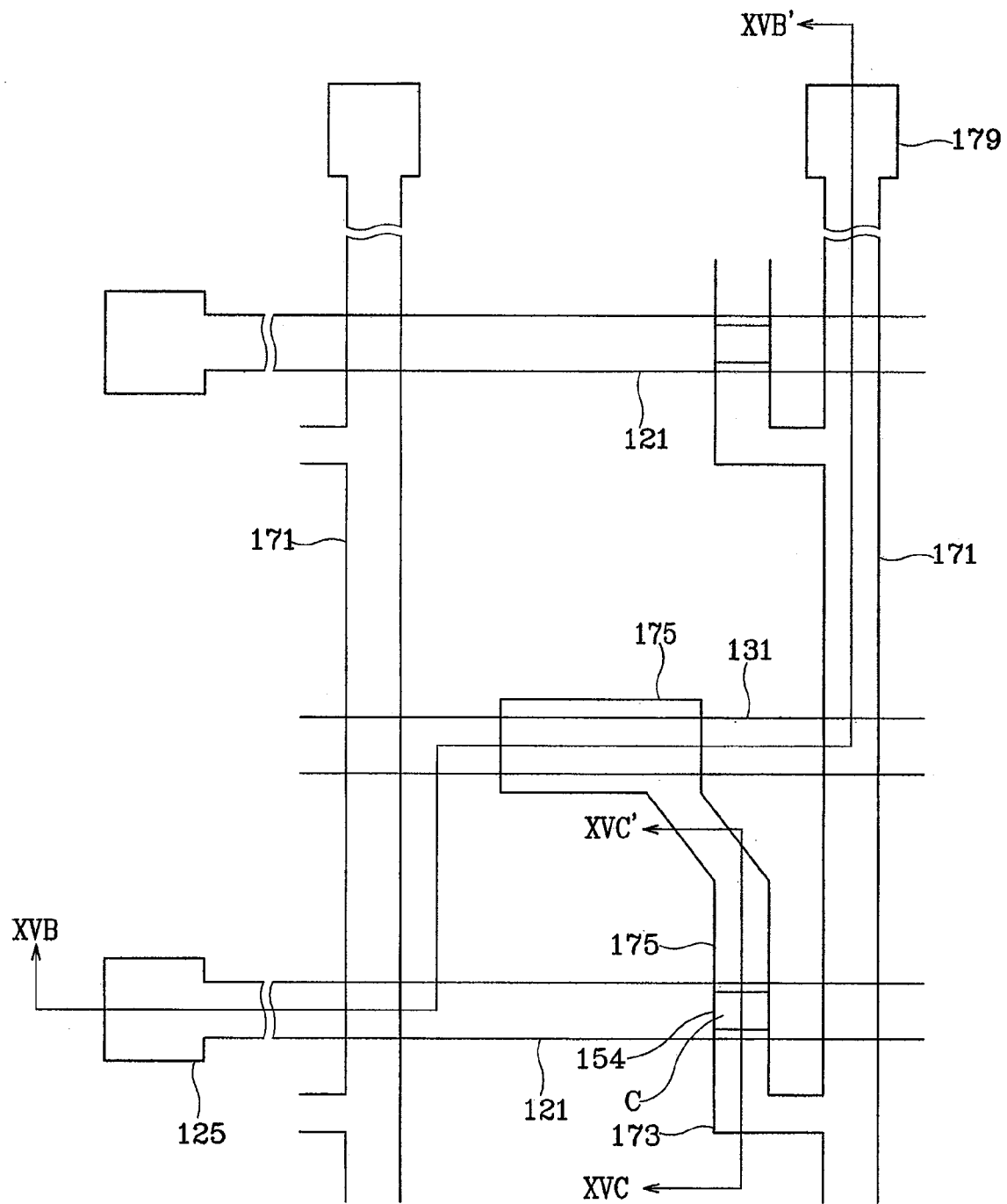
FIG. 15A is a layout view of the TFT array panel in the step following the step shown in FIGS. 14A and 14B.
Figure 15B:
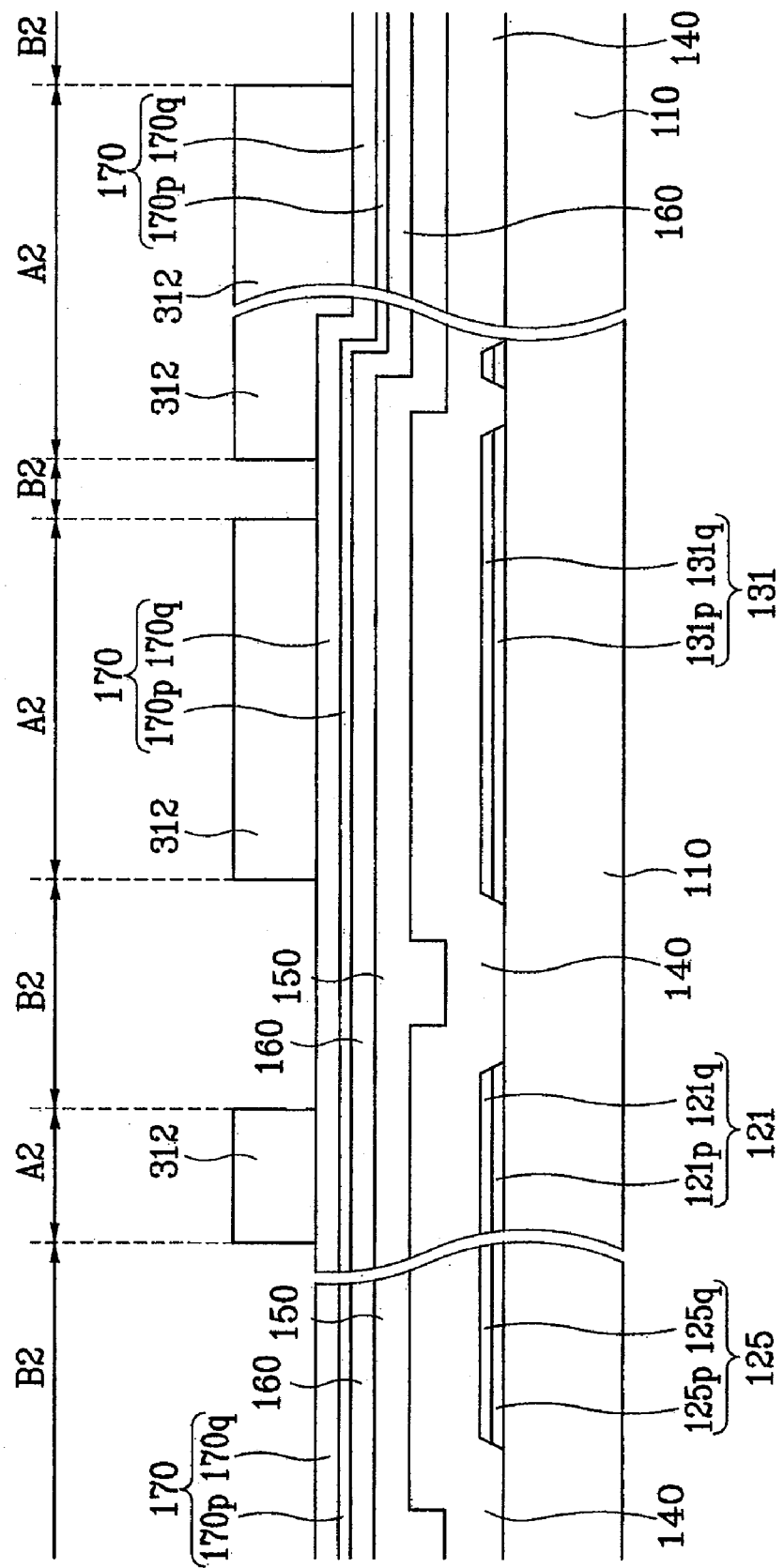
FIGS. 15B and 15C are sectional views of the TFT array panel shown in FIG. 15A taken along the lines XVB-XVB' and XVC-XVC', respectively.
Figure 15C:
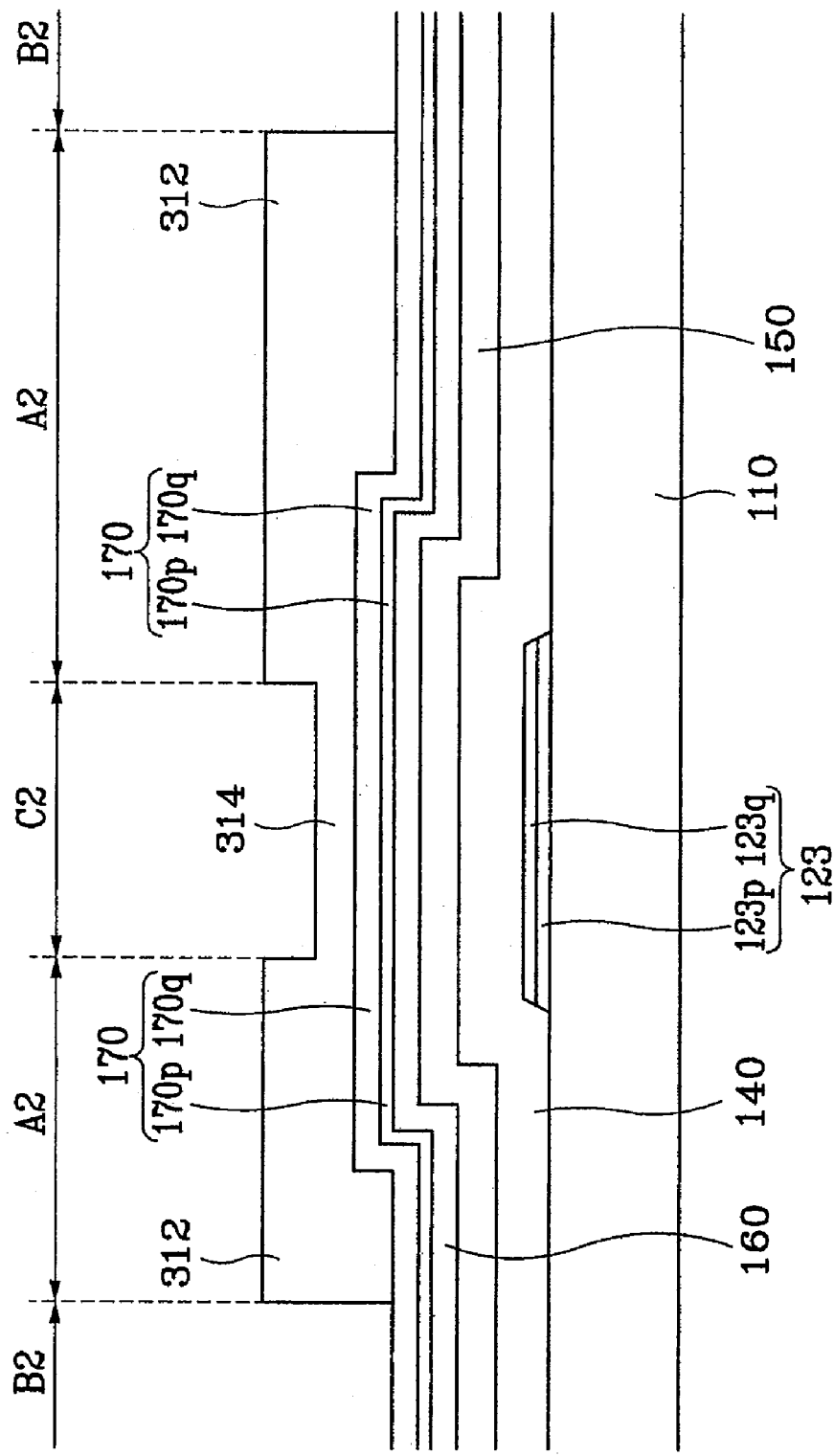

FIG. 13A is a layout view of a TFT array panel shown in FIGS. 10-12 in the first step of a manufacturing method thereof according to an embodiment of the present invention; FIGS. 13B and 13C are sectional views of the TFT array panel shown in FIG. 13A taken along the lines XIIIB-XIIIB' and XIIIC-XIIIC', respectively; FIGS. 14A and 14B are sectional views of the TFT array panel shown in FIG. 13A taken along the lines XIIIB-XIIIB' and XIIIC-XIIIC', respectively, and illustrate the step following the step shown in FIGS. 13B and 13C; FIG. 15A is a layout view of the TFT array panel in the step following the step shown in FIGS. 14A and 14B; FIGS. 15B and 15C are sectional views of the TFT array panel shown in FIG. 15A taken along the lines XVB-XVB' and XVC-XVC', respectively; FIGS. 16A, 17A and 18A and FIGS. 16B, 17B and 18B are respective sectional views of the TFT array panel shown in FIG. 15A taken along the lines XVB-XVB' and XVC-XVC', respectively, and illustrate the steps following the step shown in FIGS. 15B and 15C; FIG. 19A is a layout view of a TFT array panel in the step following the step shown in FIGS. 18A and 18B; FIGS. 19B and 19C are sectional views of the TFT array panel shown in FIG. 19A taken along the lines XIXB-XIXB' and XIXC-XIXC', respectively; and FIGS. 20A, 21A and 22A and FIGS. 20B, 21B and 22B are respective sectional views of the TFT array panel shown in FIG. 19A taken along the lines XIXB-XIXB' and XIXC-XIXC', respectively, and illustrate the steps following the step shown in FIGS. 19B and 19C.

Referring to FIGS. 13A-13C, a plurality of gate lines 121 including a plurality of gate electrodes 123 and a plurality of storage electrode lines 131 are formed on a substrate 110 by photo etching. The gate lines 121 and the storage electrode lines 131 include lower films 121p and 131p and the upper films 121q and 131q.

As shown in FIGS. 12A and 13B, a gate insulating layer 140, an intrinsic a-Si layer 150, and an extrinsic a-Si layer 160 are sequentially deposited by CVD such that the layers 140, 150 and 160 bear thickness of about 1,500-5,000 Å, about 500-2,000 Å and about 300-600 Å, respectively. A conductive layer 170 including a lower film 170p and an upper film 170q is deposited by sputtering, and a photoresist film 310 with the thickness of about 1-2 microns is coated on the conductive layer 170.

The photoresist film 310 is exposed to light through an exposure mask (not shown), and developed such that the developed photoresist has a position dependent thickness. The photoresist shown in FIGS. 15B and 15C includes a plurality of first to third portions with decreased thickness. The first portions located on wire areas A2 and the second portions located on channel areas C2 are indicated by reference numerals 312 and 314, respectively, and no reference numeral is assigned to the third portions located on remaining areas B2 since they have substantially zero thickness to expose underlying portions of the conductive layer 170. The thickness ratio of the second portions 314 to the first portions 312 is adjusted depending upon the process conditions in the subsequent process steps. It is preferable that the thickness of the second portions 314 is equal to or less than half of the thickness of the first portions 312, and in particular, equal to or less than 4,000 Å.

The different thickness of the photoresist 312 and 314 enables to selectively etch the underlying layers when using suitable process conditions. Therefore, a plurality of data lines 171 including a plurality of source electrodes 173 and a plurality of drain electrodes 175 as well as a plurality of ohmic contact stripes 161 including a plurality of projections 163, a plurality of ohmic contact islands 165 and a plurality of semiconductor stripes 151 including a plurality of projections 154 are obtained by a series of etching steps.

For descriptive purpose, portions of the conductive layer 170, the extrinsic a-Si layer 160, and the intrinsic a-Si layer 150 on the wire areas A2 are called first portions, portions of the conductive layer 170, the extrinsic a-Si layer 160, and the intrinsic a-Si layer 150 on the channel areas C2 are called second portions, and portions of the conductive layer 170, the extrinsic a-Si layer 160, and the intrinsic a-Si layer 150 on the remaining areas B2 are called third portions.

An exemplary sequence of forming such a structure is as follows:
(1) Removal of third portions of the conductive layer 170, the extrinsic a-Si layer 160 and the intrinsic a-Si layer 150 on the wire areas A2;
(2) Removal of the second portions 314 of the photoresist;
(3) Removal of the second portions of the conductive layer 170 and the extrinsic a-Si layer 160 on the channel areas C2; and
(4) Removal of the first portions 312 of the photoresist.

Another exemplary sequence is as follows:
(1) Removal of the third portions of the conductive layer 170;
(2) Removal of the second portions 314 of the photoresist;
(3) Removal of the third portions of the extrinsic a-Si layer 160 and the intrinsic a-Si layer 150;
(4) Removal of the second portions of the conductive layer 170;
(5) Removal of the first portions 312 of the photoresist; and
(6) Removal of the second portions of the extrinsic a-Si layer 160.

The first example is described in detail.

Figure 16A:
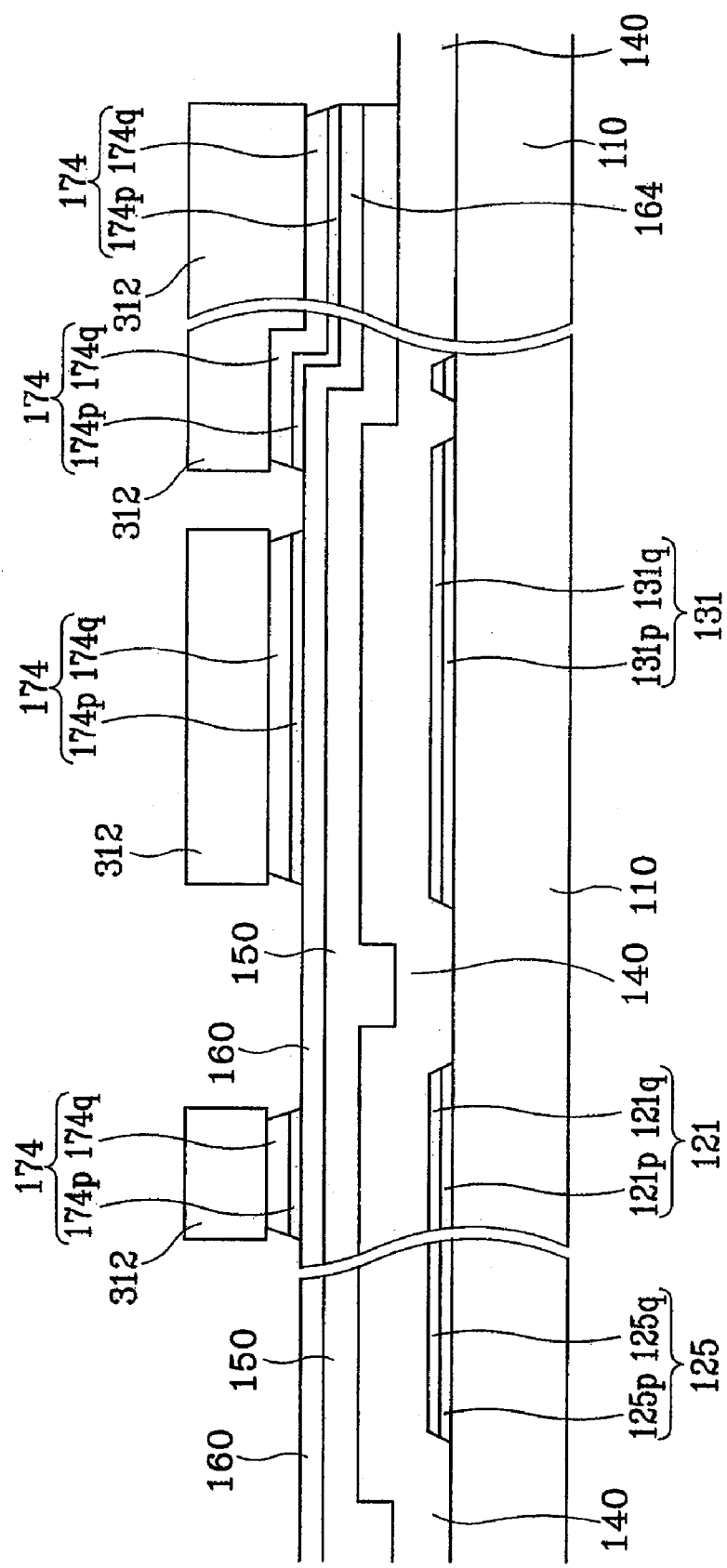

As shown in FIGS. 16A and 16B, the exposed third portions of the conductive layer 170 on the remaining areas B2 are removed by wet etching or dry etching to expose the underlying third portions of the extrinsic a-Si layer 160. A Mo, MoW, Al, Ta or Ta film can be etched by any of dry etching and wet etching, while a Cr film is hardly etched by dry etching. When the lower film 170p is made of Cr, wet etching with an etchant of $CeNHO_3$ can be used. When the lower film 170p is Mo or MoW, a gas mixture of $CF_4$ and HCl or a gas mixture of $CF_4$ and O2 can be used and the latter gas mixture etches the photoresist by an etching ratio similar to that of the conductive film.

Reference numeral 174 indicates portions of the conductive layer 170 including the data lines 171 and the drain electrode 175 connected to each other. The dry etching may etch out the top portions of the photoresist 312 and 314.

Figure 17A:
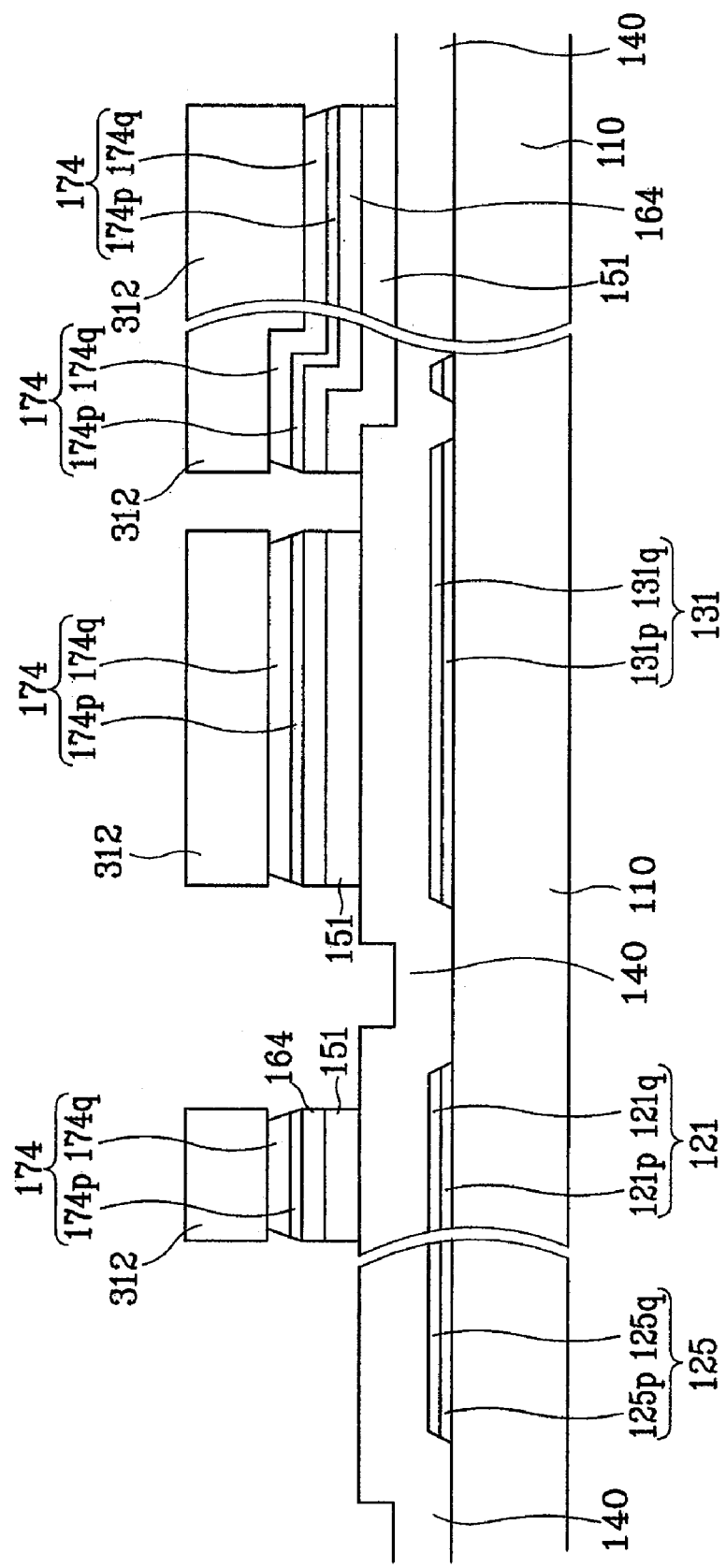

Referring to FIGS. 17A and 17B, the third portions of the extrinsic a-Si layer 160 on the areas B2 and of the intrinsic a-Si layer 150 are removed preferably by dry etching and the second portions 314 of the photoresist are removed to expose the second portions of the conductors 174. The removal of the second portions 314 of the photoresist are performed either simultaneously with or independent from the removal of the third portions of the extrinsic a-Si layer 160 and of the intrinsic a-Si layer 150. A gas mixture of $SF_6$ and HCl or a gas mixture of $SF_6$ and $O_2$ can etch the a-Si layers 150 and 160 and the photoresist by nearly the same etching ratio. Residue of the second portions 314 of the photoresist remaining on the channel areas C2 is removed by ashing.

The semiconductor stripes 151 are completed in this step, and reference numeral 164 indicates portions of the extrinsic a-Si layer 160 including the ohmic contact stripes and islands 161 and 165 connected to each other, which are called "extrinsic semiconductor stripes."

Figure 18A:
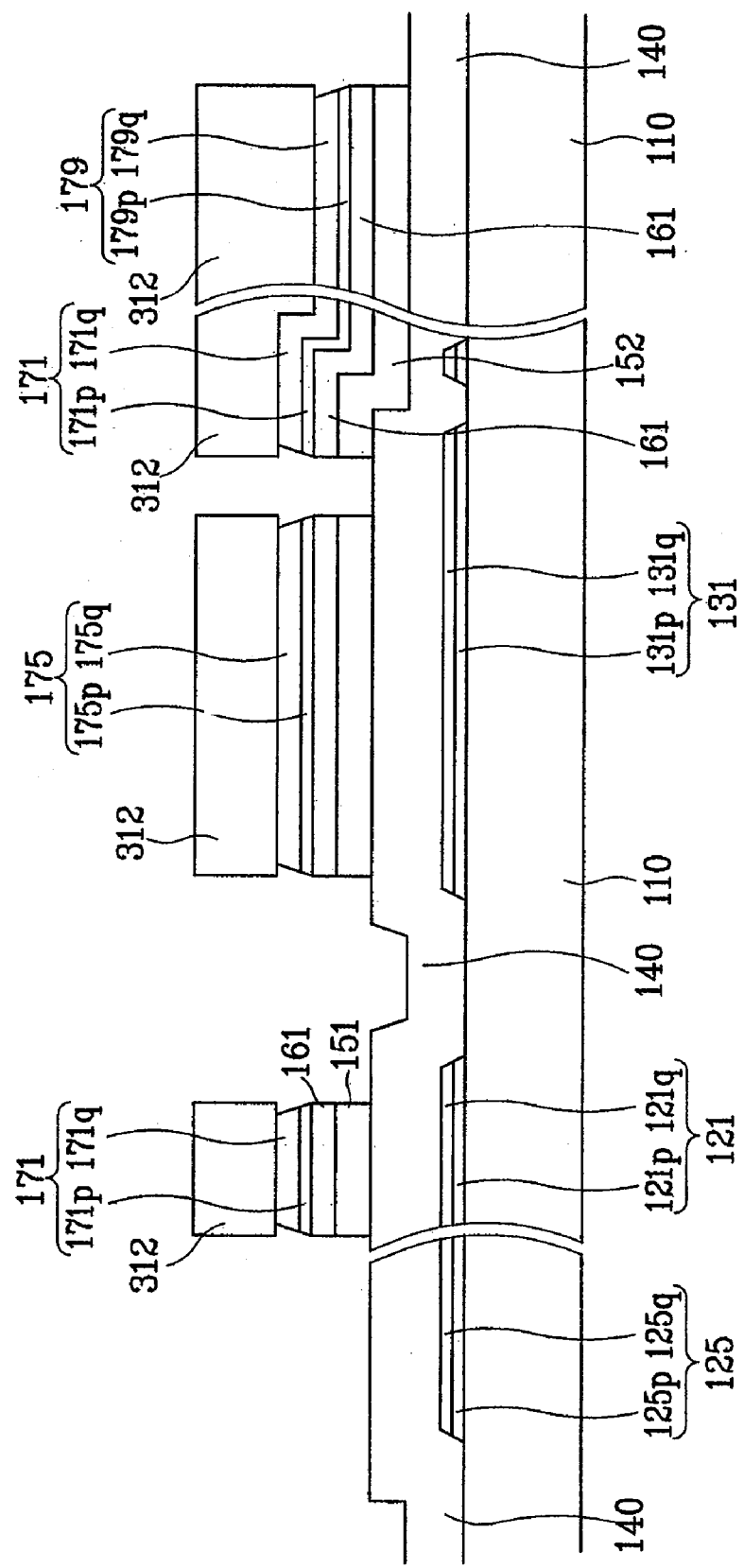
Figure 18B:
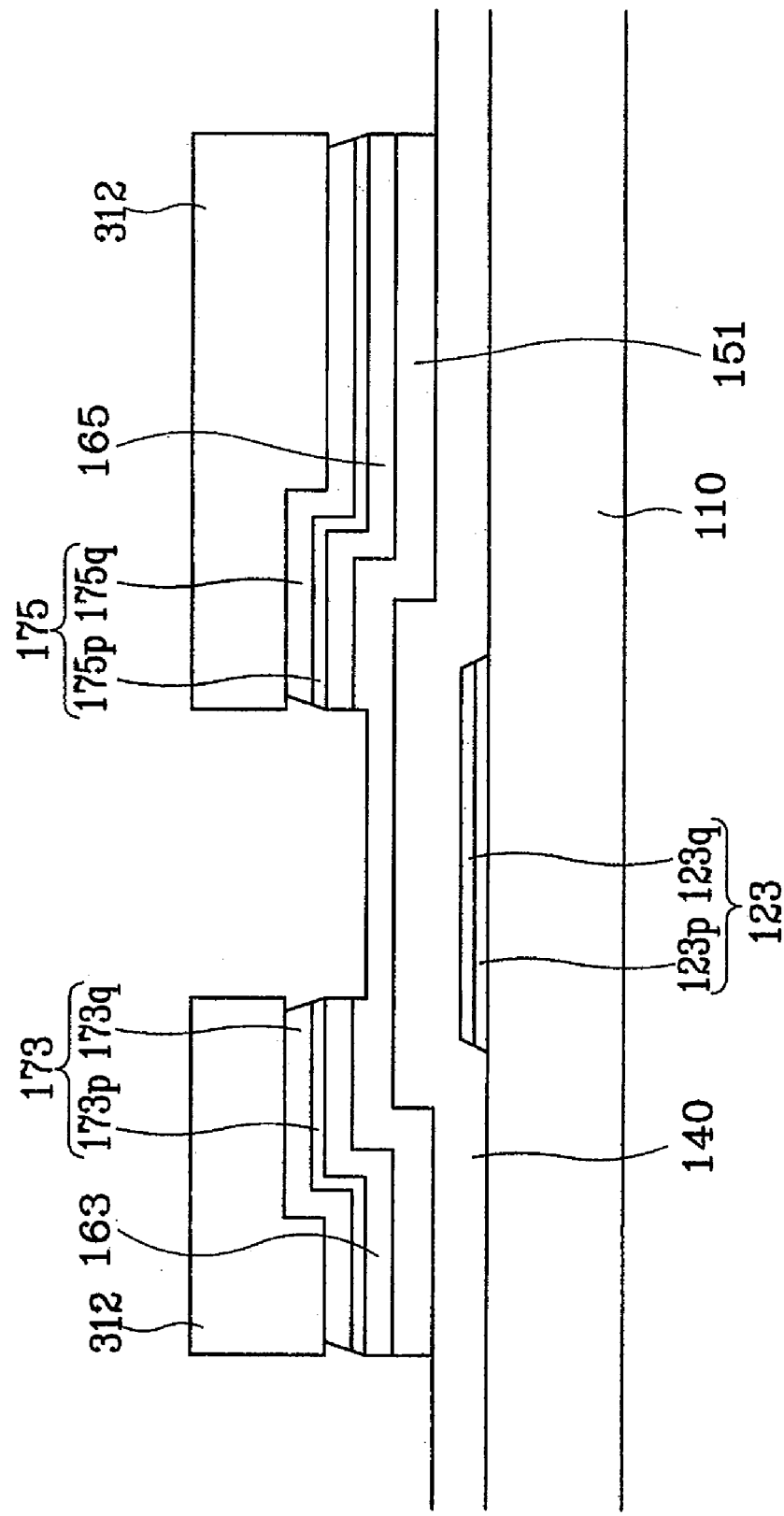
Figure 19A:
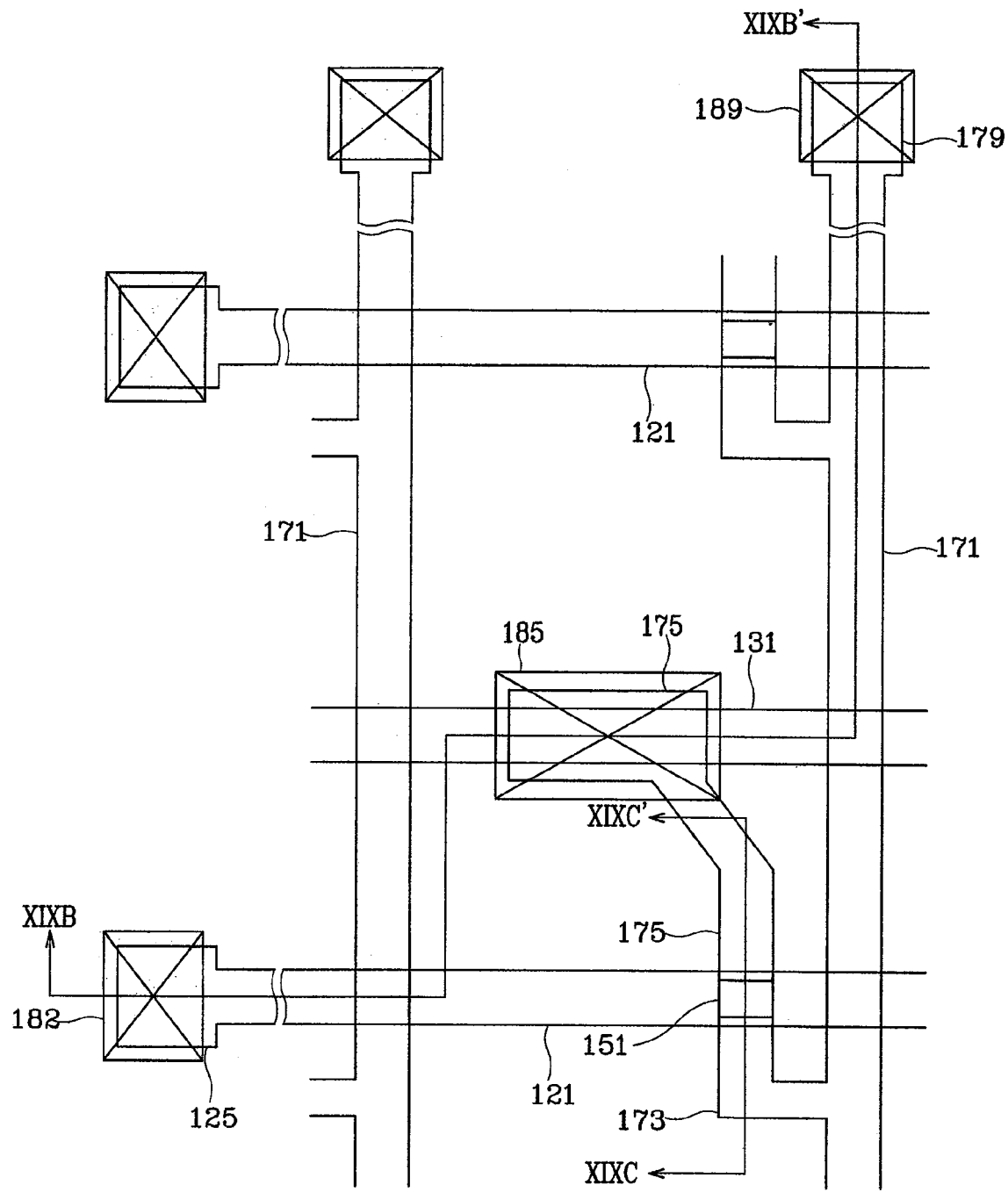
FIG. 19A is a layout view of a TFT array panel in the step following the step shown in FIGS. 18A and 18B.
Figure 19E:
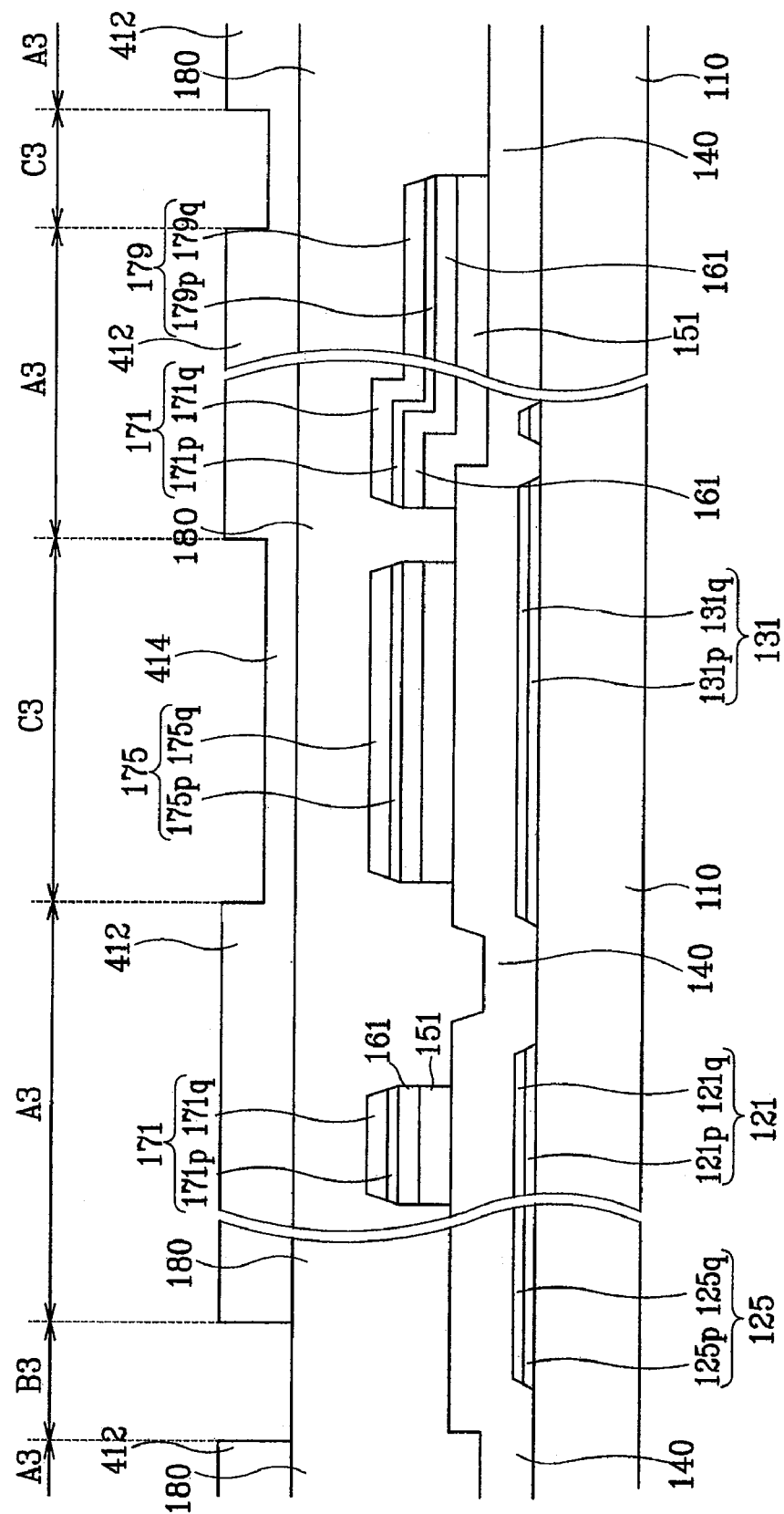
FIGS. 19B and 19C are sectional views of the TFT array panel shown in FIG. 19A taken along the lines XIXB-XIXB' and XIXC-XIXC', respectively.

As shown in FIGS. 18A and 18B, the second portions of the conductors 174 and the extrinsic a-Si stripes 164 on the channel areas C2 as well as the first portion 312 of the photoresist are removed.

Both the conductors 174 and the extrinsic semiconductor stripes 164 may be dry etched with a gas mixture of $SF_6$ and $O_2$.

Alternatively, the conductors 174 are dry etched, while the extrinsic semiconductor stripes 164 are dry etched. Since lateral sides of the conductors 174 are also dry etched, while lateral sides of the extrinsic semiconductor stripes 164 are hardly etched, step-wise lateral profiles are obtained. Examples of the gas mixtures are $CF_4$ and HCl and $CF_4$ and $O_2$, as described above. The latter gas mixture leaves uniform thickness of the intrinsic semiconductor stripes 151.

As shown in FIG. 18B, top portions of the projections 154 of the intrinsic semiconductor stripes 151 on the channel areas C2 may be removed to cause thickness reduction, and the first portions 312 of the photoresist are etched to a predetermined thickness.

In this way, each conductor 174 is divided into a data line 171 and a plurality of drain electrodes 175 to be completed, and each extrinsic semiconductor stripe 164 is divided into an ohmic contact stripe 161 and a plurality of ohmic contact islands 165 to be completed.

As shown in FIGS. 19A and 19B, after depositing a passivation layer 180, a photoresist film 410 is spin-coated on the passivation layer 180. The photoresist film 410 is exposed to light through an exposure mask (not shown), and developed such that the developed photoresist has a position dependent thickness. The photoresist shown in FIG. 19B includes a plurality of first to third portions with decreased thickness. The first portions in areas A3 and the second portions in active contact areas C3 located on portions of the drain electrodes 175 are indicated by reference numerals 412 and 414, respectively, and no reference numeral is assigned to the third portions in peripheral contact areas B3 located on the end portions 125 of the gate lines 121 since they have substantially zero thickness to expose underlying portions of the passivation layer 180. The portions 414 located on the end portions 179 of the data lines 179 may have the same thickness as the third portions. The thickness ratio of the second portions 414 to the first portions 412 is adjusted depending upon the process conditions in the subsequent process steps. It is preferable that the thickness of the second portions 414 is equal to or less than the thickness of the passivation layer 180.

The different thickness of the photoresist 412 and 414 enables to selectively etch the underlying layers when using suitable process conditions. Therefore, a plurality of contact holes 182, 185, 187 and 189 having different thickness are obtained.

For descriptive purposes, portions on the areas A3 are called first portions, portions of the passivation layer 180, the drain electrodes 175, the data lines 171, and the gate insulating layer 140 on the active contact areas C3 are called second portions, and portions of the passivation layer 180, the gate insulating layer 140, and the gate lines 121 on the peripheral contact areas B2 are called third portions.

Figure 20A:
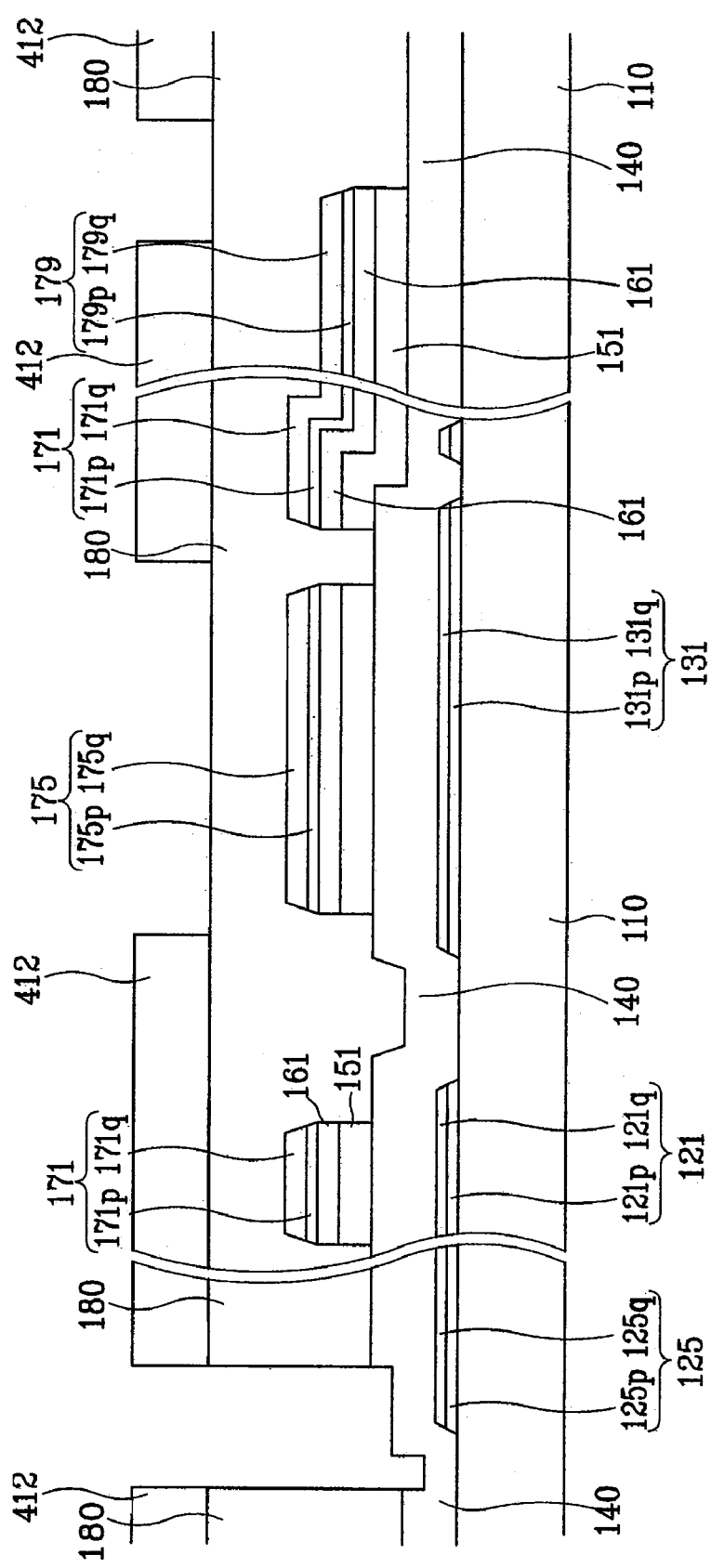

An exemplary sequence of forming such a structure is as follows:

As shown in FIGS. 20A and 20B, the exposed third portions of the passivation layer 180 on the peripheral contact areas B3 are removed by etching. Although the dry etching may etch out the top portions of the second portions of the passivation layer 180 and the third portions of the gate insulating layer 140, it is preferable that the third portions of the gate insulating layer 140 are thinner than the second portions of the passivation layer 180 so that the second portions of the gate insulating layer 140 may not be removed in later steps. Residue of the second portions 414 of the photoresist remaining on the active contact areas C3 is removed by ashing to completely expose the second portions of the passivation layer 180.

Figure 21A:
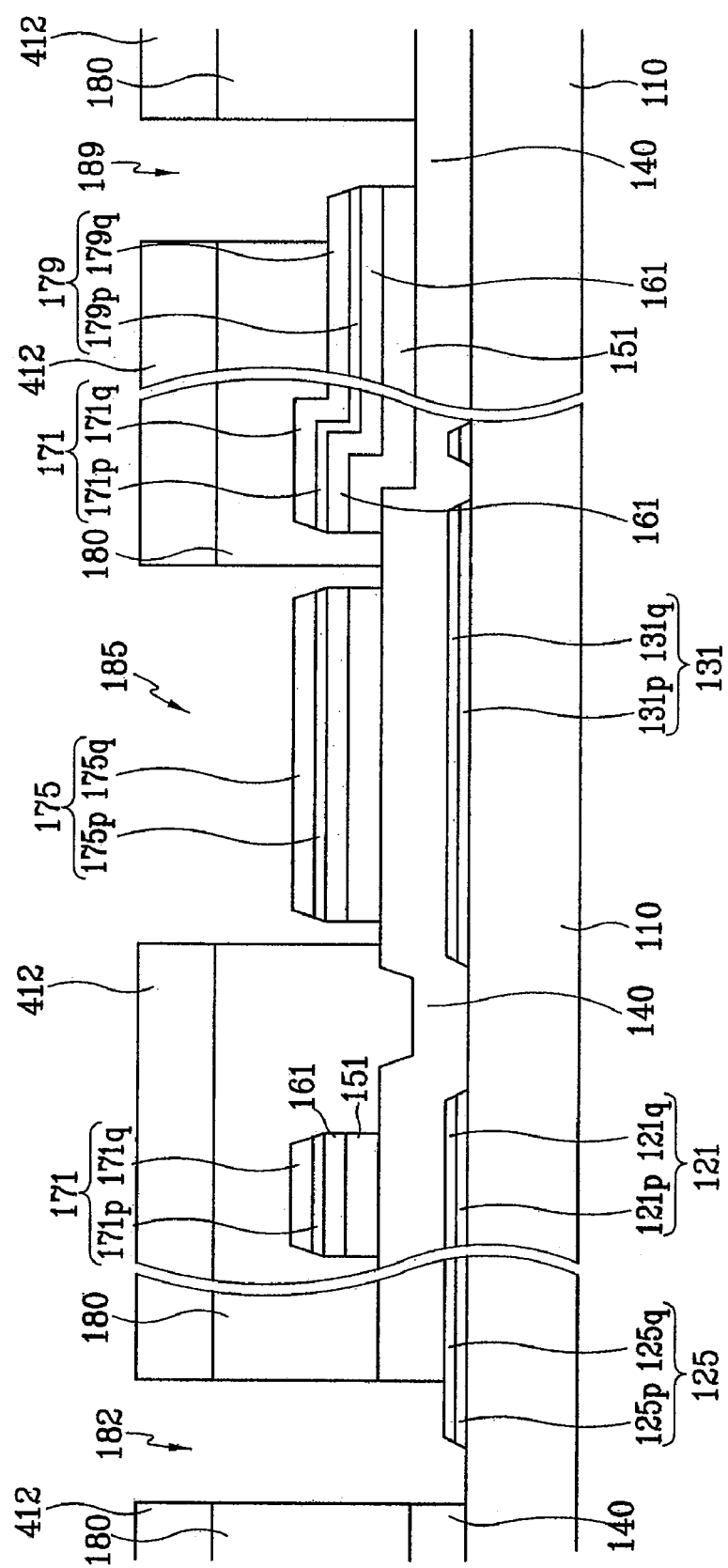
Figure 21B:
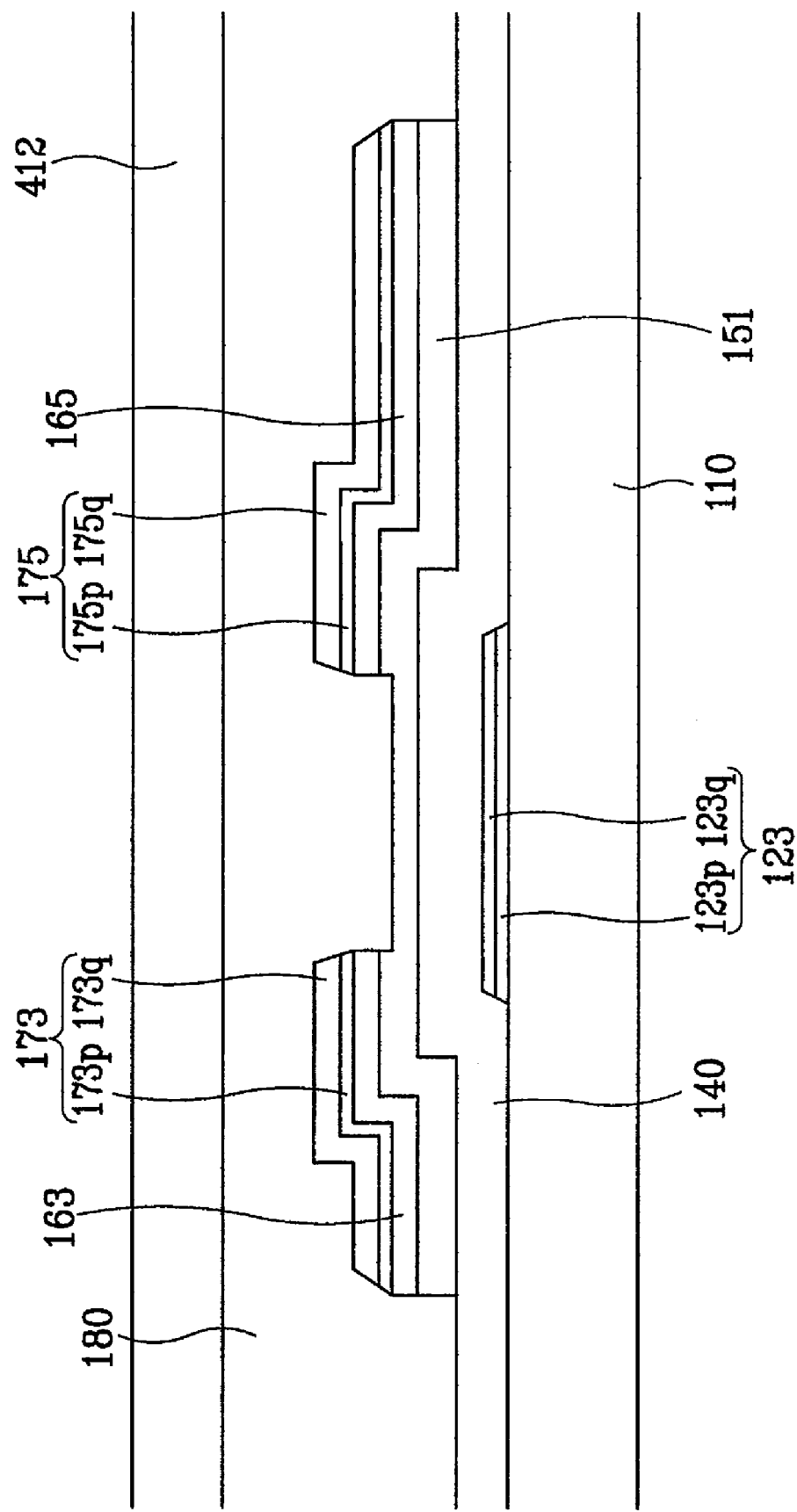

Referring to FIGS. 21A and 21B, the third portions of the gate insulating layer 140 and the second portions of the passivation layer 180 are removed to complete the contact holes 182, 185 and 189. The removal of those portions are made by dry etching under the condition that the etching ratios for the gate insulating layer 140 and the passivation layer 180 are substantially equal. Since the thickness of the third portions of the gate insulating layer 140 is smaller than that of the second portions of the passivation layer 180, the third portions of the gate insulating layer 140 and the second portions of the passivation insulating layer 180 are completely removed, and simultaneously, the second portions of the gate insulating layer 140 remain to prevent the undercut of the gate insulating layer 140 under the drain electrodes 175.

Figure 22A:
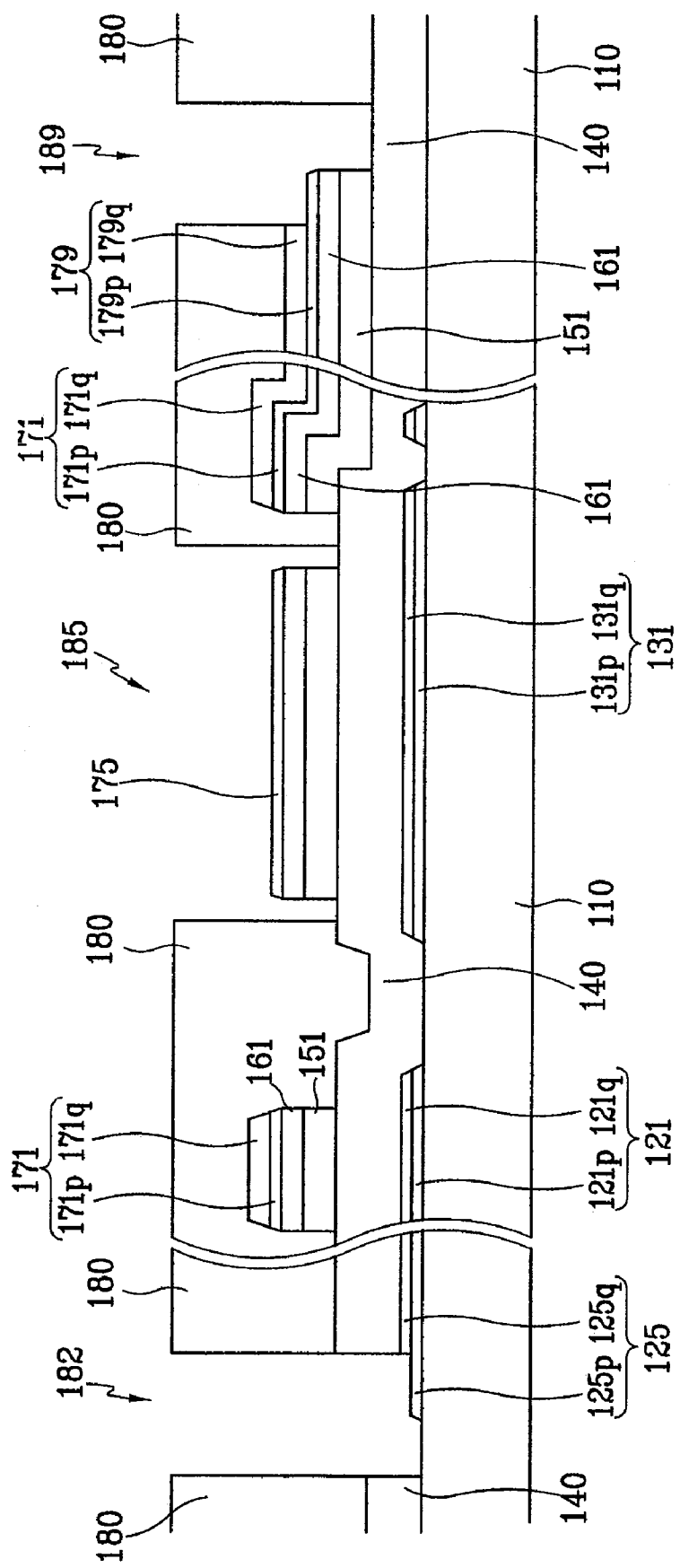
Figure 22B:
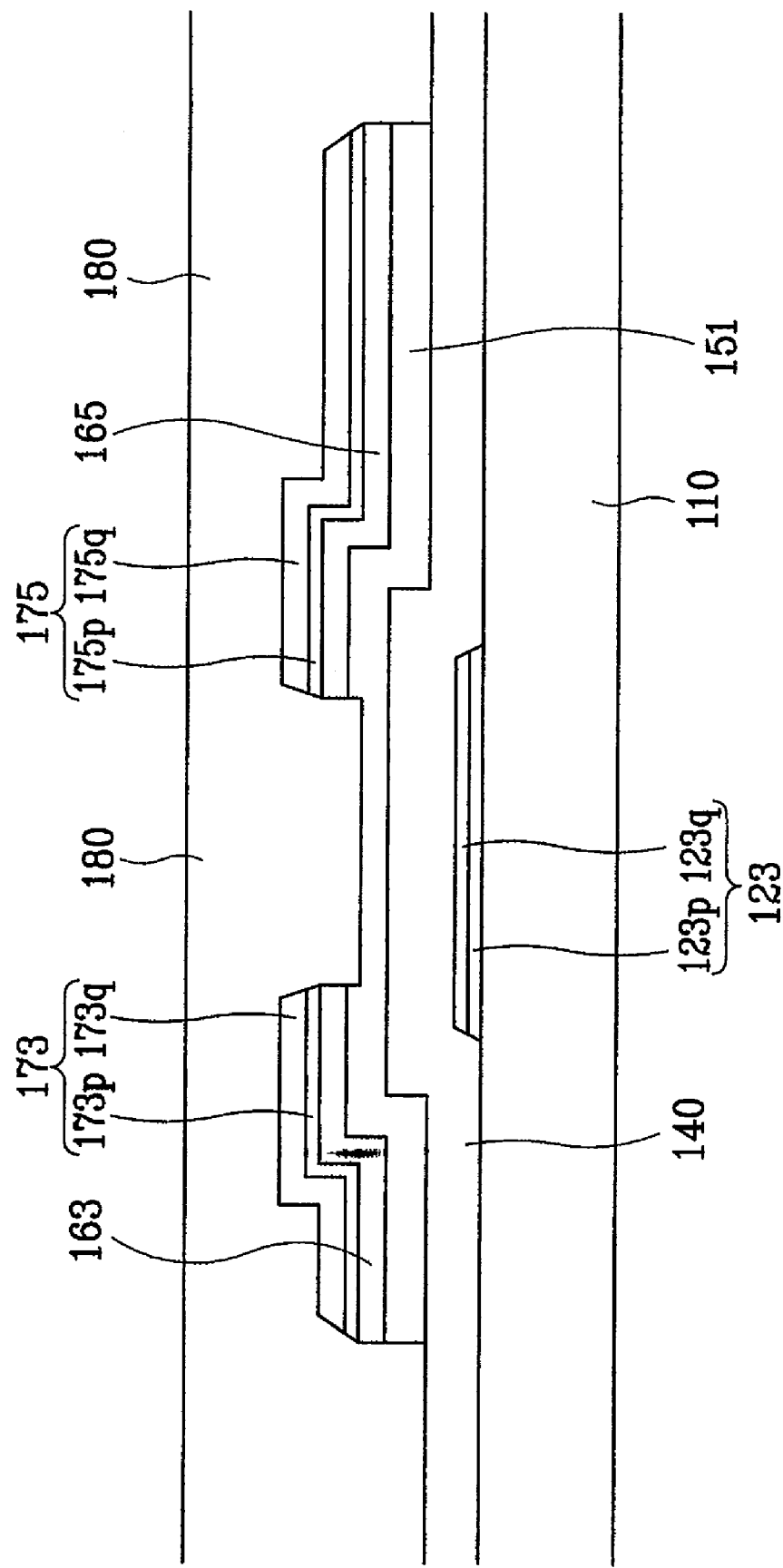

As shown in FIGS. 22A and 22B, the third portions of the upper film 125$q$ of the end portions 125 of the gate lines 121 and the second portions of the upper films 175$q$ and 179$q$ of the drain electrodes 175, and the end portions 179 of the data lines 171 are removed to expose the underlying lower films 125$p$, 175$q$ and 179$q$.

Finally, as shown in FIGS. 10 to 12, an ITO or IZO layer with a thickness in a range between about 500 Å and about 1,500 Å is sputtered and photo-etched to form a plurality of pixel electrodes 191 and a plurality of contact assistants 192 and 199. The etching of the IZO layer preferably includes wet etching using a Cr etchant of $HNO_3/(NH_4)_2Ce(NO_3)_6/H_2O$, which does not erode Al of the data lines 171 and the drain electrodes 175.

This embodiment simplifies the manufacturing process by forming the data lines 171 and the drain electrodes 175 as well as the ohmic contacts 161 and 165 and the semiconductor stripes 151 and using a single photolithography step.

A TFT array panel for an LCD according to another embodiment of the present invention will be described in detail with reference to FIGS. 23 and 24.

Figure 23:
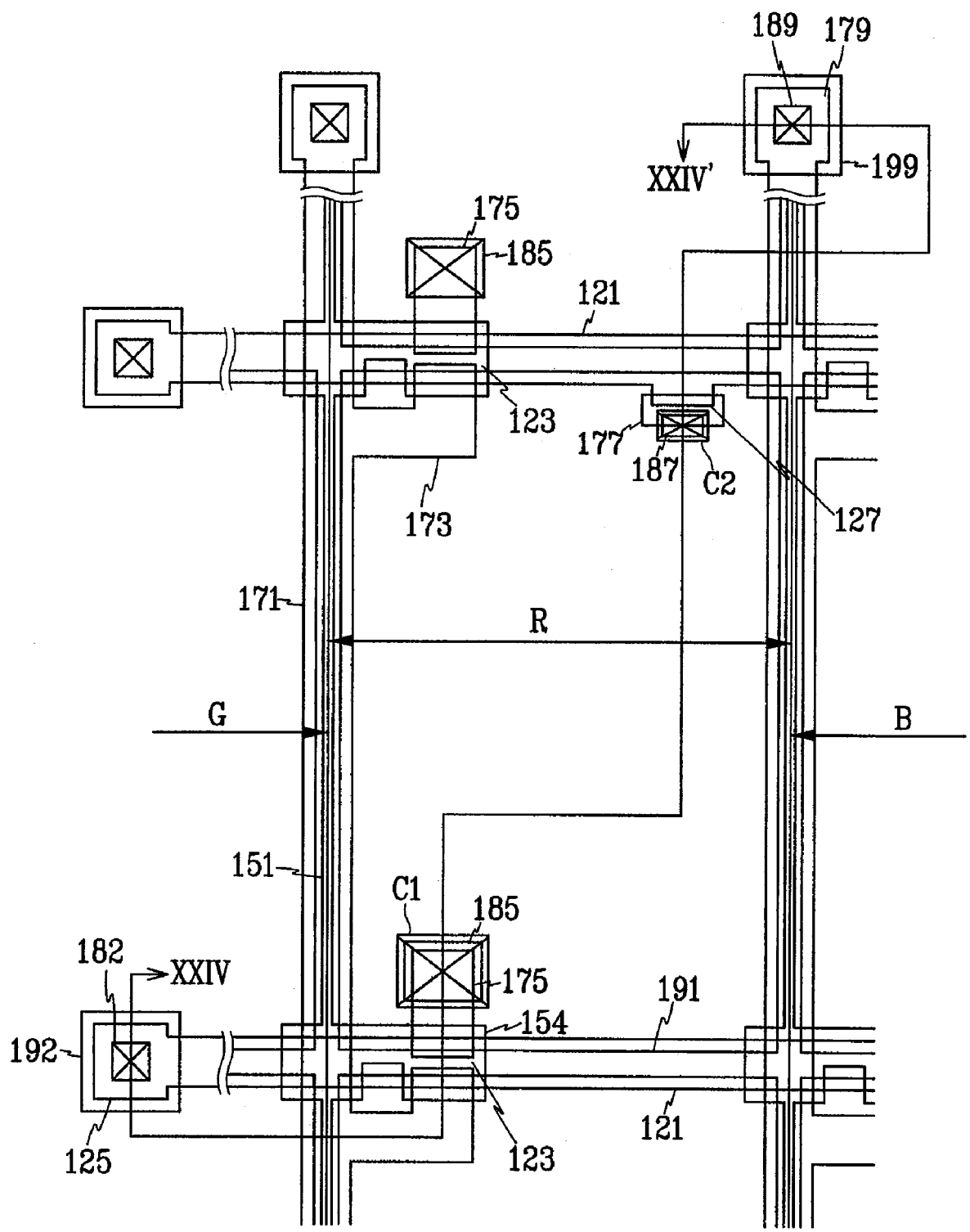
FIG. 23 is a layout view of an exemplary TFT array panel for an LCD according to another embodiment of the present invention.
Figure 24:
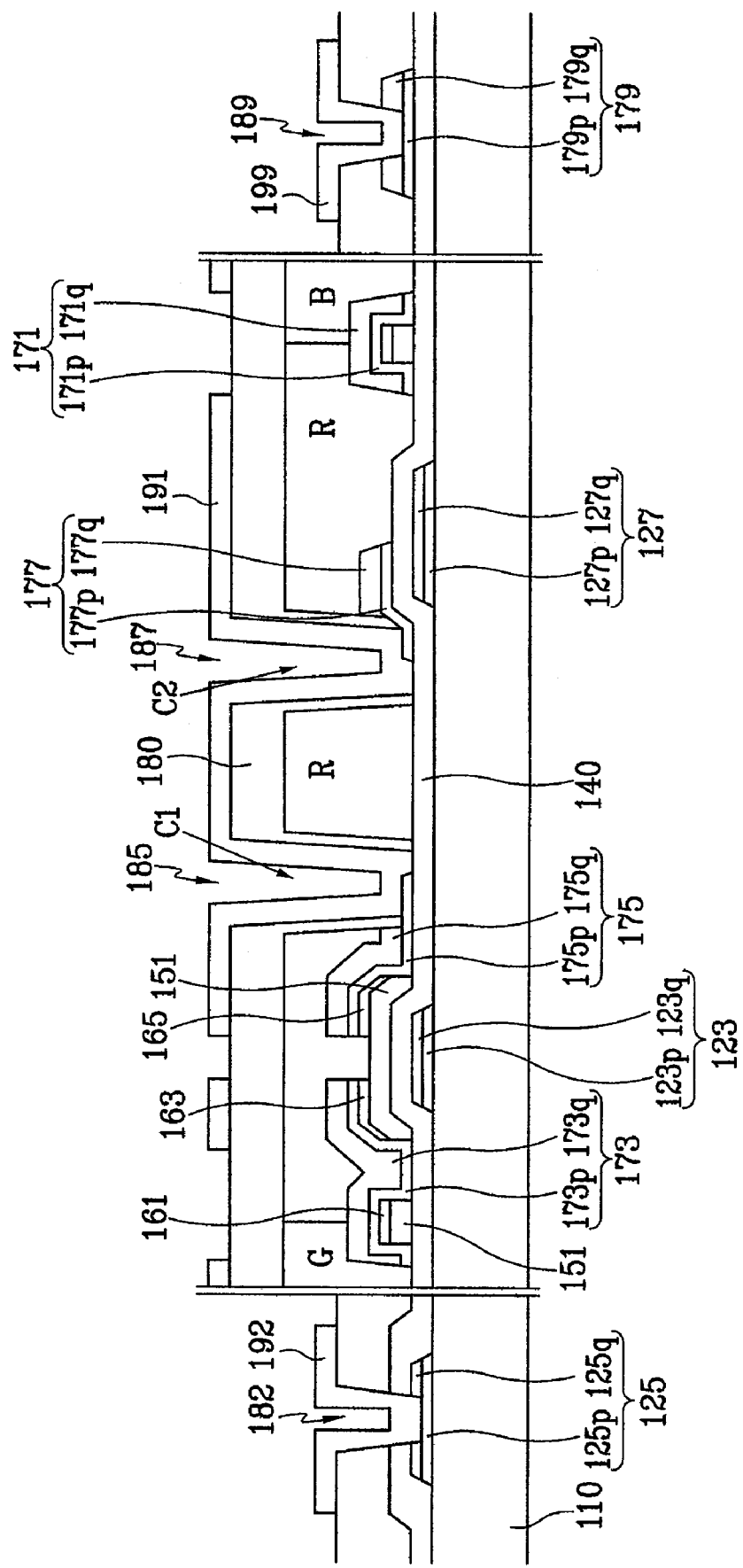
FIG. 24 is a sectional view of the TFT array panel shown in FIG. 23 taken along the line XXIII-XXIII'.

FIG. 23 is a layout view of an exemplary TFT array panel for an LCD according to another embodiment of the present invention, and FIG. 24 is a sectional view of the TFT array panel shown in FIG. 23 taken along the line XXIV-XXIV'.

As shown in FIGS. 23 and 24, a layered structure of a TFT array panel of an LCD according to this embodiment is almost the same as that shown in FIGS. 2 and 3. That is, a plurality of gate lines 121 including a plurality of gate electrodes 123 and a plurality of projections 127 are formed on a substrate 110, and a gate insulating layer 140, a plurality of semiconductor stripes 151 including a plurality of projections 154, and a plurality of ohmic contact stripes 161 including a plurality of projections 163 and a plurality of ohmic contact islands 165 are sequentially formed thereon. A plurality of data lines 171 including a plurality of source electrodes 173, a plurality of drain electrodes 175, and a plurality of storage capacitor conductors 177 are formed on the ohmic contacts 161 and 165 and the gate insulating layer 140, and a passivation layer 180 is formed thereon. A plurality of contact holes 182, 185, 187 and 189 are provided at the passivation layer 180 and/or the gate insulating layer 140, and a plurality of pixel electrodes 191 and a plurality of contact assistants 192 and 199 are formed on the passivation layer 180.

Different from the TFT array panel shown in FIGS. 2 and 3, a plurality of red, green and blue color filters R, G and B are formed under the passivation layer 180. The color filters R, G and B has a plurality of openings C1 and C2 exposing the drain electrodes 175 and the storage capacitor conductors 177. The color filters R, G and B overlap each other to prevent light leakage and the contact holes 185 and 187 is disposed within the openings C1 and C2.

As described above, the edges of the drain electrodes are exposed with the gate insulating layer remaining under the drain electrodes to prevent the undercut at the signal lines and to smooth the profiles of the contact portions such that the disconnection of the pixel electrodes is prevented. In addition, the lower film having low contact resistance is exposed to secure the reliability of the contact portions. Furthermore, the upper film having low resistivity is included to improve the quality of the product. Moreover, the manufacturing method is simplified.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A thin film transistor array panel comprising:
   a gate line formed on an insulating substrate;
   a gate insulating layer on the gate line;
   a semiconductor layer on the gate insulating layer;
   a data line formed on the gate insulating layer and including a source electrode;
   a drain electrode formed on at least part of the semiconductor layer;
   a color filter formed on the data line and the drain electrode;
   a passivation layer formed on the color filter layer and having a first contact hole exposing the drain electrode at least in part and a portion of an upper surface of the gate insulating layer;
   a pixel electrode formed on the passivation layer and contacting the drain electrode and the exposed portion of the gate insulating layer through the first contact hole.

2. The thin film transistor array panel of claim 1, wherein at least one of the gate line, the data line, and the drain electrode comprises a lower film of Cr, Mo or Mo alloy and an upper film of Al or Al alloy.

3. The thin film transistor array panel of claim 2, wherein the passivation layer comprises organic material or inorganic material.

4. The thin film transistor array panel of claim 3, wherein the pixel electrode comprises IZO.

5. The thin film transistor array panel of claim 4, wherein the passivation layer has second and third contact holes exposing end portions of the gate line and the data line, and the thin film transistor array panel further comprises contact assistants contacting the exposed end portions of the gate line and the data line.

* * * * *